(12) United States Patent
Yamada et al.

(10) Patent No.: US 12,131,252 B2
(45) Date of Patent: Oct. 29, 2024

(54) NEUROMORPHIC DEVICE

(71) Applicant: TDK CORPORATION, Tokyo (JP)

(72) Inventors: Shogo Yamada, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 444 days.

(21) Appl. No.: 17/507,561

(22) Filed: Oct. 21, 2021

(65) Prior Publication Data

US 2022/0188618 A1    Jun. 16, 2022

(30) Foreign Application Priority Data

Oct. 23, 2020   (WO) .................. PCT/JP2020/039957

(51) Int. Cl.
*G06N 3/065* (2023.01)
*G11C 11/16* (2006.01)
*G11C 11/54* (2006.01)
*H10B 61/00* (2023.01)
*H10N 50/80* (2023.01)

(52) U.S. Cl.
CPC ............ *G06N 3/065* (2023.01); *G11C 11/161* (2013.01); *G11C 11/1675* (2013.01); *G11C 11/54* (2013.01); *H10B 61/00* (2023.02); *H10N 50/80* (2023.02)

(58) Field of Classification Search
CPC ......... H10B 61/00; G06N 3/065; H10N 50/80
USPC ....................................................... 257/427
See application file for complete search history.

(56) References Cited

U.S. PATENT DOCUMENTS

| 10,600,461 B2 * | 3/2020 | Shibata ............... G11C 11/1675 |
| 2011/0129691 A1 | 6/2011 | Shiwata et al. |
| 2018/0358105 A1 | 12/2018 | Sasaki |
| 2020/0334015 A1 * | 10/2020 | Shibata .................. G06F 7/523 |

(Continued)

FOREIGN PATENT DOCUMENTS

| JP | 2002-359355 A | 12/2002 |
| JP | 2005-150303 A | 6/2005 |

(Continued)

OTHER PUBLICATIONS

Koyama, T. et al., "Observation of the Intrinsic Pinning of a Magnetic Domain Wall in a Ferromagnetic Nanowire", Nature Materials, vol. 10, Mar. 2011, pp. 194-197.

*Primary Examiner* — Jami Valentine Miller
(74) *Attorney, Agent, or Firm* — Oliff PLC

(57) ABSTRACT

A neuromorphic device includes: first and second element groups, in which each includes magnetic domain wall movement elements, each of which includes magnetic domain wall movement and ferromagnetic layers, and a non-magnetic layer between the magnetic domain wall movement and ferromagnetic layers, a length of the magnetic domain wall movement layer of each of the magnetic domain wall movement elements belonging to the first element group in a longitudinal direction is shorter than a length of the magnetic domain wall movement layer of each of the magnetic domain wall movement elements belonging to the second element group in the longitudinal direction, and a resistance changing rate when a predetermined pulse is input is higher for each of the magnetic domain wall movement elements belonging to the first element group than for each of the magnetic domain wall movement elements belonging to the second element group.

15 Claims, 23 Drawing Sheets

(56) References Cited

U.S. PATENT DOCUMENTS

| | | | | |
|---|---|---|---|---|
| 2021/0110857 A1* | 4/2021 | Endoh | .................. | G11C 5/02 |
| 2022/0109101 A1* | 4/2022 | Yamada | ................ | H10N 50/10 |
| 2022/0376168 A1* | 11/2022 | Yamada | ................ | H10N 50/85 |
| 2024/0020520 A1* | 1/2024 | Yamada | ................ | H10B 61/22 |
| 2024/0074323 A1* | 2/2024 | Yamada | ............. | G11C 11/1673 |

FOREIGN PATENT DOCUMENTS

| | | | |
|---|---|---|---|
| JP | 2007-258460 A | | 10/2007 |
| JP | 5441005 | B2 | 3/2014 |
| JP | 6617829 | B2 | 12/2019 |
| WO | 2016/159017 | A1 | 10/2016 |
| WO | 2019/176540 | A1 | 9/2019 |
| WO | 2019/188252 | A1 | 10/2019 |

* cited by examiner

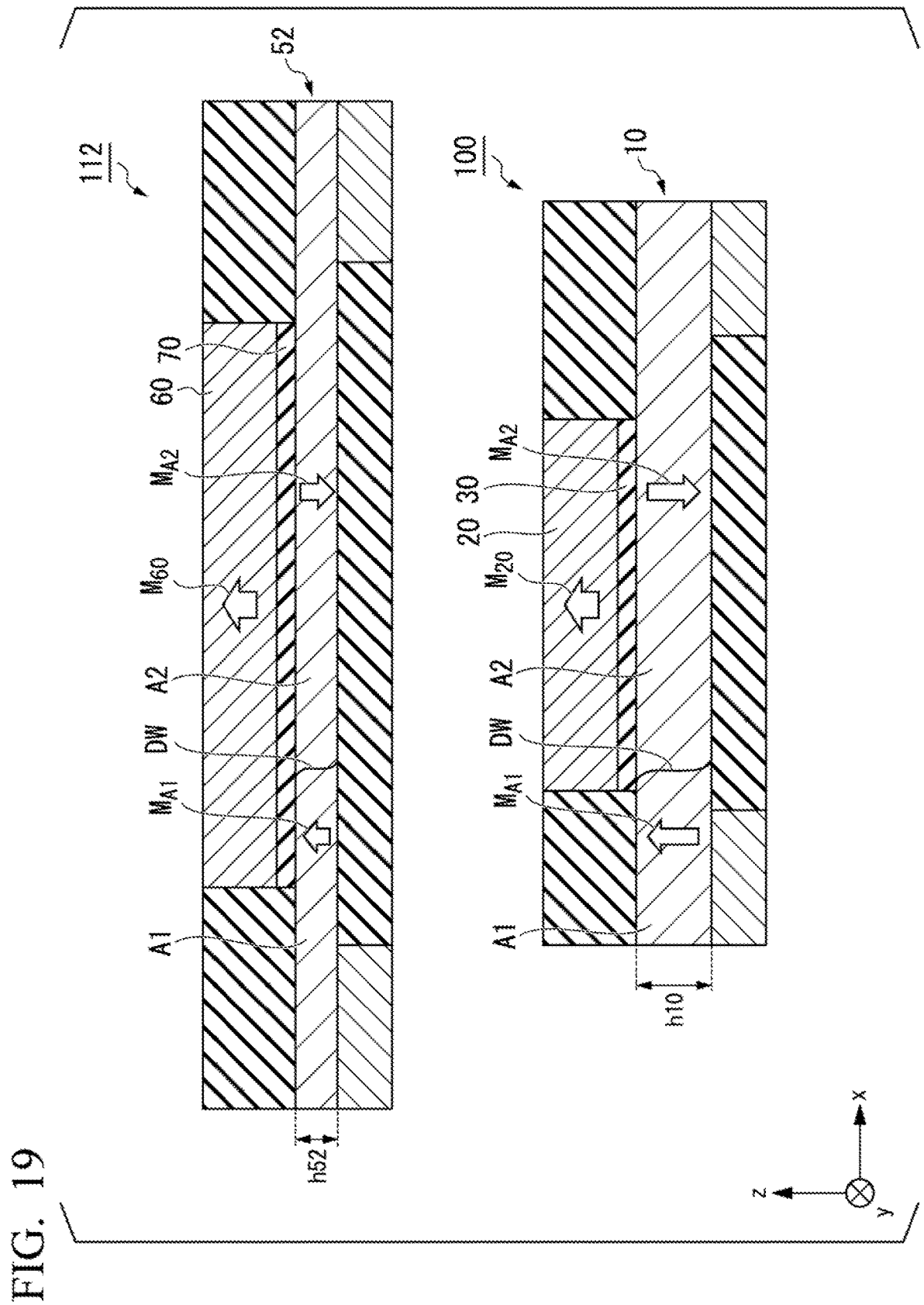

NEUROMORPHIC DEVICE

Priority is claimed on Japanese Patent Application No. PCT/JP2020/039957, filed Oct. 23, 2020, the content of which is incorporated herein by reference.

BACKGROUND OF THE INVENTION

Field of the Invention

The present invention relates to a neuromorphic device.

Description of Related Art

Magnetoresistance effect elements using resistance value changes (magnetoresistance changes) based on changes in the relative angle of magnetization of two ferromagnetic layers am known. Among magnetoresistance effect elements, there are elements in which the current path when writing data and the current path when reading data are different from each other. In such magnetoresistance effect elements, in order to control the currents of different current paths, three switching elements are connected. Magnetoresistance effect elements controlled using three switching elements are called magnetoresistance effect elements of a three-terminal type.

For example, a magnetoresistance effect element of a magnetic domain wall movement type disclosed in Patent Document 1 is one example of the magnetoresistance effect element of the three-terminal type.

In recent years, research on neuromorphic devices artificially imitating a relation between neurons and a synapse in the human brain has progressed.

For example, a magnetic neuro element disclosed in Patent Document 2 is one example of a neuromorphic device using the magnetoresistance effect element of the magnetic domain wall movement type.

PATENT DOCUMENTS

[Patent Document 1] Japanese Patent No. 5441005
[Patent Document 2] Japanese Patent No. 6617829

SUMMARY OF THE INVENTION

Variable resistance elements such as magnetoresistance effect elements are frequently used in an integrated form. From the point of view of increasing a storage capacity, an increase in the integration of a device in which variable resistance elements are integrated is desired. As a method for increasing the integration of variable resistance elements, a method for decreasing the size of the variable resistance elements has been reviewed.

However, when the variable resistance elements are configured to be small, the identification rate of the neuromorphic device decreases.

The present invention is in view of the problems described above, and an object thereof is to provide a neuromorphic device of which the integration of variable resistance elements is high and an identification rate is improved.

(1) According to a first aspect, there is provided a neuromorphic device including: a first element group; and a second element group, in which each of the first element group and the second element group includes a plurality of magnetic domain wall movement elements, each of the plurality of magnetic domain wall movement elements includes a magnetic domain wall movement layer, a ferromagnetic layer, and a non-magnetic layer interposed between the magnetic domain wall movement layer and the ferromagnetic layer, a length of the magnetic domain wall movement layer of each of the magnetic domain wall movement elements belonging to the first element group in a longitudinal direction is shorter than a length of the magnetic domain wall movement layer of each of the magnetic domain wall movement elements belonging to the second element group in the longitudinal direction, and a resistance changing rate when a predetermined pulse is input is higher for each of the magnetic domain wall movement elements belonging to the first element group than for each of the magnetic domain wall movement elements belonging to the second element group.

(2) In the neuromorphic device according to the aspect described above, the first element group and the second element group may be inside a laminated structural body, and the laminated structural body may be stacked on a substrate.

(3) In the laminated structural body included in the neuromorphic device according to the aspect described above, the second element group may be at a position further away from the substrate than the first element group.

(4) In the neuromorphic device according to the aspect described above, the number of the magnetic domain wall movement elements belonging to the first element group may be larger than the number of the magnetic domain wall movement elements belonging to the second element group.

(5) In the neuromorphic device according to the aspect described above, a critical current density required for moving a magnetic domain wall of the magnetic domain wall movement element may be lower in each of the magnetic domain wall movement elements belonging to the second element group than in each of the magnetic domain wall movement elements belonging to the first element group.

(6) In a plan view in a stacking direction of the magnetic domain wall movement element included in the neuromorphic device according to the aspect described above, any one of the magnetic domain wall movement elements of the first element group and any one of the magnetic domain wall movement elements of the second element group may at least partially overlap each other.

(7) In a longitudinal direction of any one of the magnetic domain wall movement elements belonging to the second element group of the neuromorphic device according to the aspect described above, both ends of any one of the magnetic domain wall movement elements of the first element group may be inside both ends of any one of the magnetic domain wall movement elements of the second element group.

(8) In a plan view in a stacking direction of the magnetic domain wall movement element of the neuromorphic device according to the aspect described above, the magnetic domain wall movement elements of the first element group and the magnetic domain wall movement elements of the second element group may not overlap each other.

(9) In the neuromorphic device according to the aspect described above, a surface roughness of a lower face of the magnetic domain wall movement element belonging to the second element group may be higher than a surface roughness of a lower face of the magnetic domain wall movement element belonging to the first element group.

(10) The neuromorphic device according to the aspect described above may further include a connection wiring connecting any one of the magnetic domain wall movement elements of the first element group and any one of the magnetic domain wall movement elements of the second element group.

(11) In the neuromorphic device according to the aspect described above, the first element group may perform a first multiply/accumulate operation, the second element group may perform a second multiply/accumulate operation, and a sum of outputs from the plurality of magnetic domain wall movement elements belonging to the first element group may be input to the magnetic domain wall movement element belonging to the second element group.

(12) In the neuromorphic device according to the aspect described above, a pulse length of a write pulse input to the magnetic domain wall movement elements belonging to the second element group may be different from a pulse length of a write pulse input to the magnetic domain wall movement elements belonging to the first element group.

(13) In the neuromorphic device according to the aspect described above, a pulse amplitude of a write pulse input to the magnetic domain wall movement elements belonging to the second element group may be different front a pulse amplitude of a write pulse input to the magnetic domain wall movement elements belonging to the first element group.

(14) In the neuromorphic device according to the aspect described above, each of the first element group and the second element group may be responsible for a calculation between different layers in a neural network.

(15) In the neuromorphic device according to the aspect described above, the first element group may be responsible for a calculation of an input layer side of a neural network from the second element group.

A neuromorphic device according to the aspect described above has high integration of variable resistance elements and has a superior identification rate.

BRIEF DESCRIPTION OF THE DRAWINGS

FIG. 19 is a cross-sectional view of a magnetic domain wall movement element belonging to a first element group and a magnetic domain wall movement element belonging to a second element group in an integrated device used in a neuromorphic device according to Modified Example 1.

DETAILED DESCRIPTION OF THE INVENTION

Hereinafter, embodiments will be described in detail with appropriate reference to the drawings. There are cases in which the drawings used in the following description may be represented with a feature part enlarged for the convenience of description for easy understanding of features, and dimensions, ratios, and the like of constituent elements may be different from actual values. Materials, dimensions, and the like illustrated in the following description are examples, and the present invention is not limited thereto. The materials, the dimensions, and the like may be appropriately changed in a range in which effects of the present invention are acquired.

First, directions will be defined. One direction of one face of a substrate Sb (see FIG. 4) is defined as an x direction, and a direction that is orthogonal to the x direction is defined as a y direction. The x direction is, for example, a direction in which a magnetic domain wall movement layer of a magnetic domain wall movement element extends. The x direction is one example of a longitudinal direction. The z direction is a direction that is orthogonal to the x direction and the y direction. The z direction is one example of a stacking direction. Hereinafter, the +z direction may be represented as "upward," and the −z direction may be represented as "downward." The +z direction is a direction away from a substrate Sb. Upward and downward do not necessarily coincide with a direction in which the force of gravity is applied.

In addition, in this specification, "extending in the x direction" represents that a length in the x direction is longer than lengths in the other directions. In this specification, "connection" is not limited to direct connection but includes connection through an interposed layer.

First Embodiment

Figure 1:
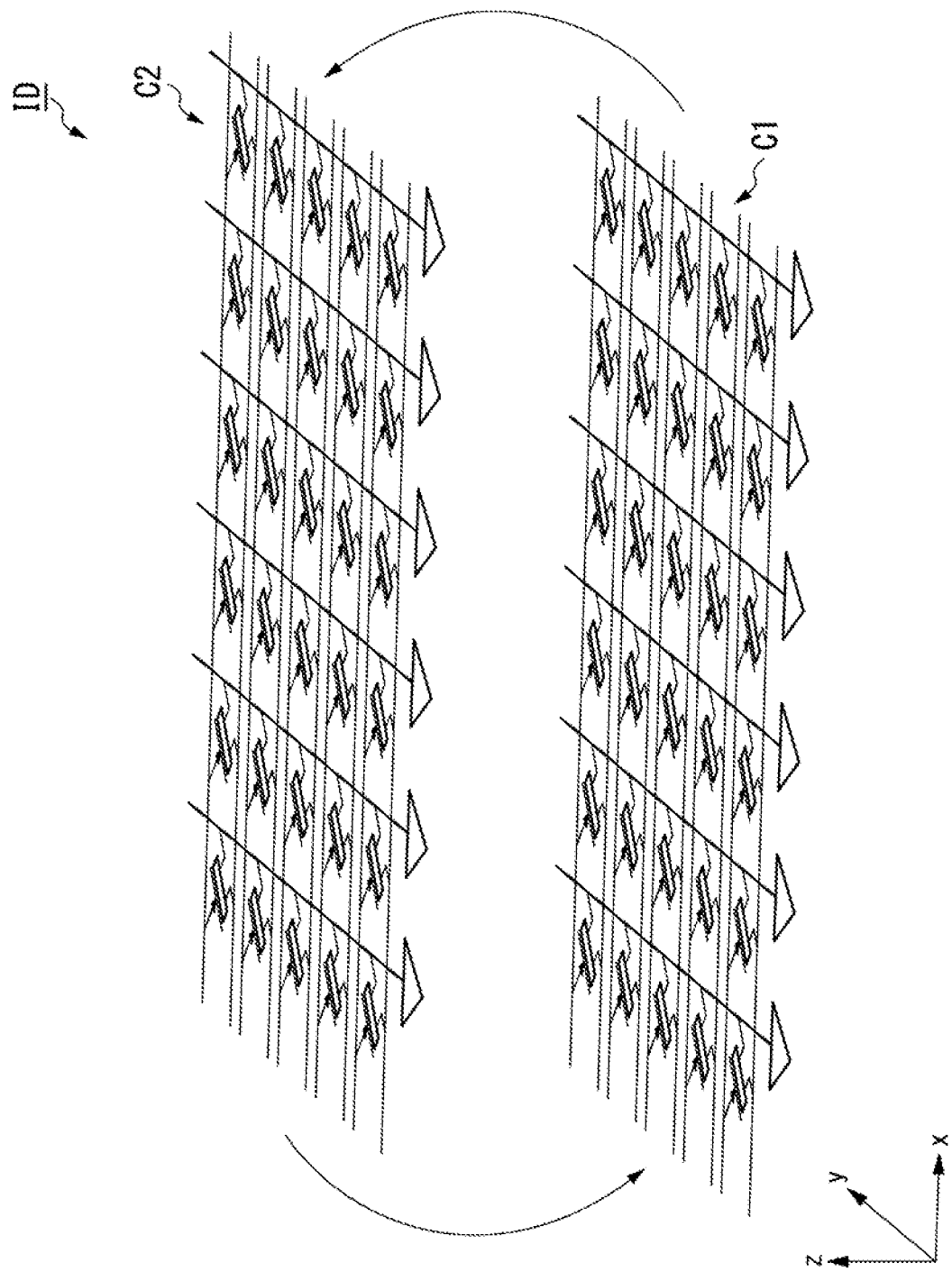
FIG. 1 is an image diagram of an integrated device according to a first embodiment.

FIG. 1 is a circuit diagram of an integrated device ID according to a first embodiment. The integrated device ID, for example, includes a first circuit C1 and a second circuit C2. The first circuit C1 and the second circuit C2 are multiply/accumulate operation circuits that perform different multiply/accumulate operations. The first circuit C1 and the second circuit C2 are connected to each other.

For example, an output of a multiply/accumulate operation performed by the first circuit C1 is input to the second circuit C2. The second circuit C2, for example, receives a result of the multiply/accumulate operation performed by the first circuit C1 as an input and additionally performs a multiply/accumulate operation.

The integrated device ID according to the first embodiment, for example, functions as a neuromorphic device. The neuromorphic device is a device that performs a calculation of a neural network. The neuromorphic device artificially imitates a relation between neurons and a synapse in the human brain.

Figure 2:
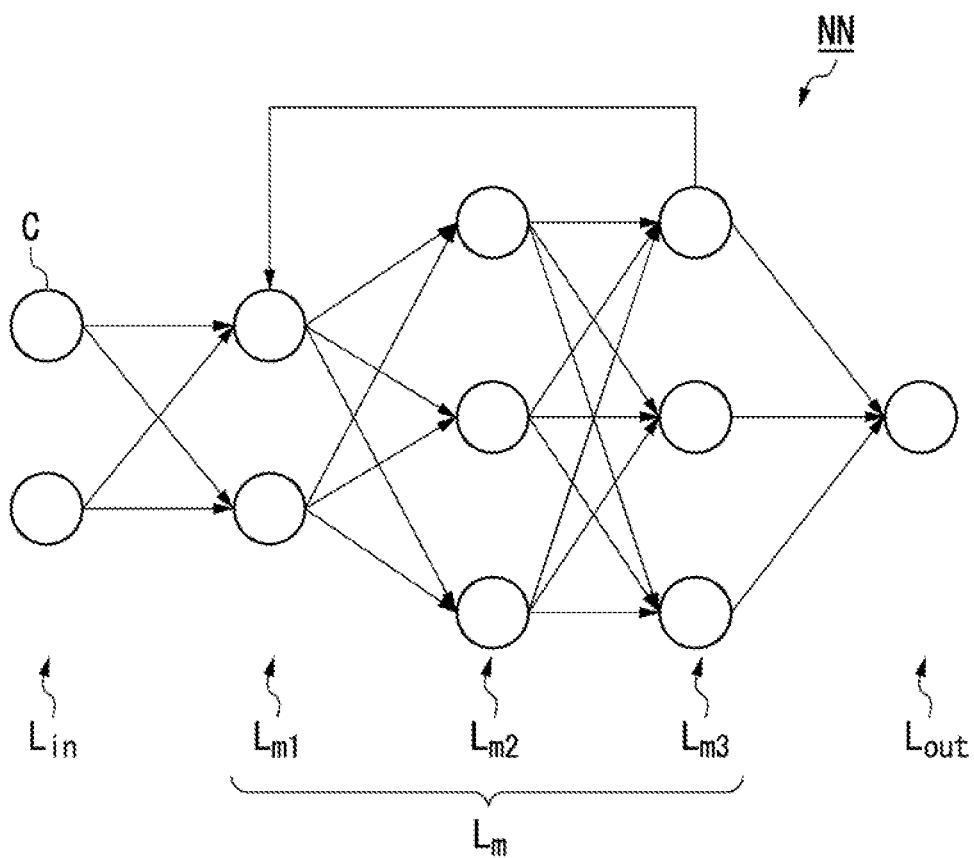
FIG. 2 is a schematic diagram of a neural network.

FIG. 2 is a schematic diagram of a neural network NN. The neural network NN includes an input layer $L_{in}$, intermediate layers $L_m$, and an output layer $L_{out}$. Although an example in which the number of the intermediate layers $L_m$ is three is presented in FIG. 2, the number of intermediate layers $L_m$ is an arbitrary. Each of the input layer $L_{in}$, the intermediate layers $L_m$, and the output layer $L_{out}$ has a plurality of chips C, and each of the chips C corresponds to a neuron in a brain. Each of the input layer $L_{in}$, the intermediate layers $L_m$, and the output layer $L_{out}$ is connected to a transmission means. The transmission means corresponds to a synapse in a brain. In the neural network NN, the transmission means (synapse) performs learning, whereby a correct answer ratio of a problem increases. The learning is finding knowledge that can be used in the future from information. The neural network NN performs learning by operating while changing a weight applied to the transmission means. The transmission means performs a product operation of applying a weight to an input signal and a sum operation of adding results of product operations. In other words, the transmission means performs multiply/accumulate operations.

In the neural network NN, resolution for each layer may be different. For example, when a hierarchical layer is closer to the output layer $L_{out}$, a weight applied to the transmission means may be delicately changed. By employing such a configuration, the identification rate of the neural network NN becomes high. In other words, in the neural network NN, a hierarchical layer closer to the output layer $L_{out}$ requires higher resolution.

The first circuit C1 illustrated in FIG. 1 is, for example, responsible for a multiply/accumulate operation from the first intermediate layer $L_{m1}$ to the second intermediate layer $L_{m2}$, and the second circuit C2 is, for example, responsible for a multiply/accumulate operation from the second intermediate layer $L_{m2}$ to the third intermediate layer $L_{m3}$.

Figure 3A:
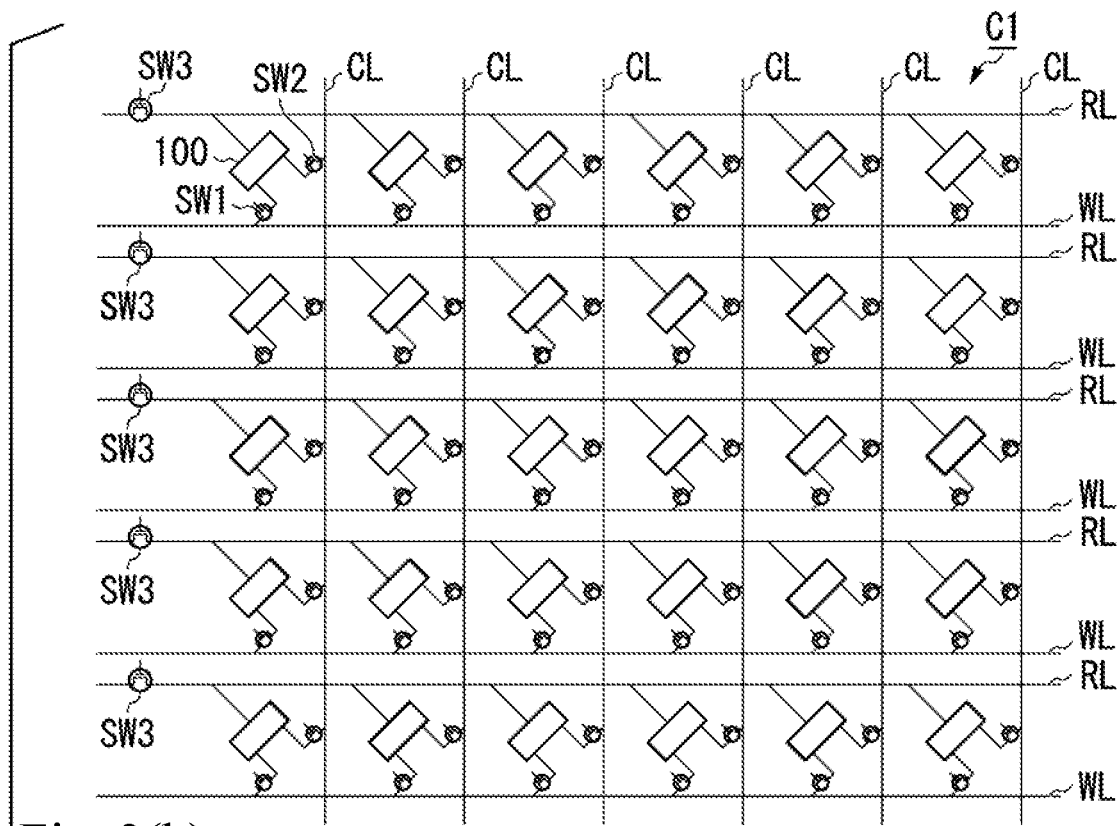
FIGS. 3A and 3B are circuit diagrams of integrated devices used in a neuromorphic device according to the first embodiment.
Figure 3B:
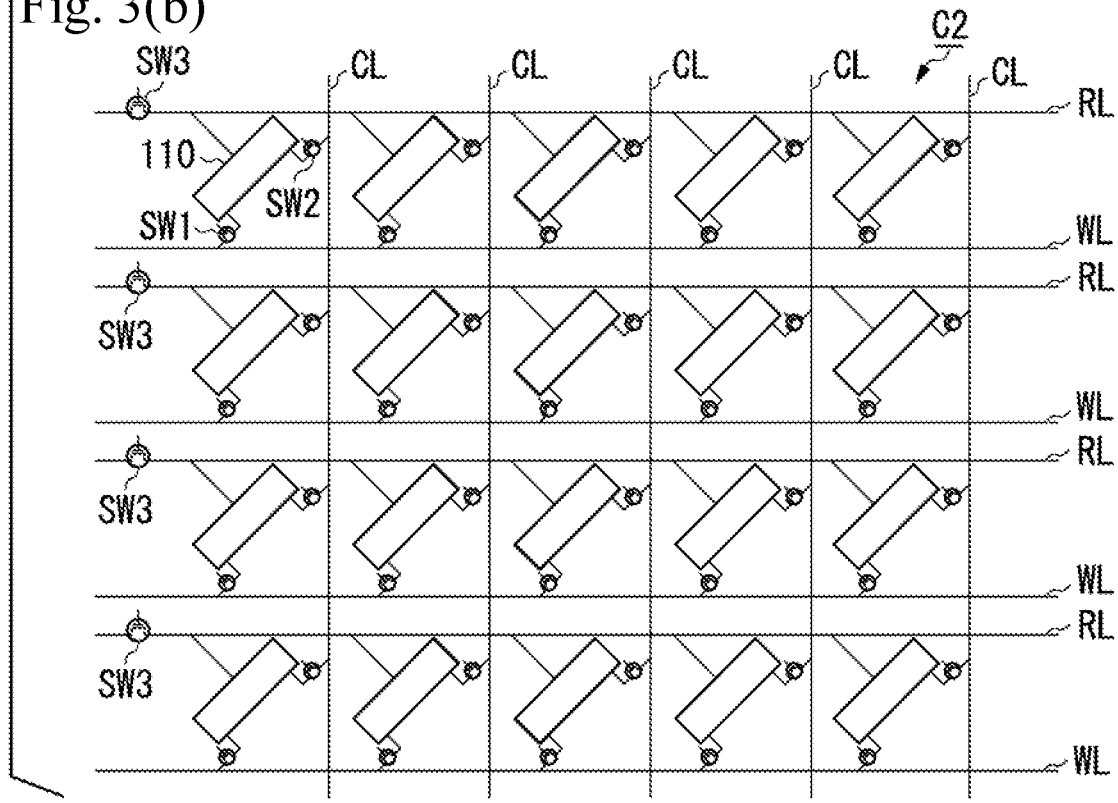

FIGS. 3A and 3B are circuit diagrams of parts of integrated devices ID according to the first embodiment. FIG. 3A is a circuit diagram of the first circuit C1, and FIG. 3B is a circuit diagram of the second circuit C2. The first circuit C1 and the second circuit C2, for example, have circuit structures similar to each other.

Each of the first circuit C1 and the second circuit C2 has a plurality of variable resistance elements. The variable resistance elements included in the first circuit C1, for example, are magnetic domain wall movement elements 100. In addition, the variable resistance elements included in the second circuit C2 are, for example, magnetic domain wall movement elements 110. The magnetic domain wall movement elements 100 and 110 are magnetoresistance effect elements of a magnetic domain wall movement type. In other words, the magnetic domain wall movement elements 100 and 110 are elements of a three-terminal type. The number of the magnetic domain wall movement elements 100 of the first circuit C1 is, for example, the same as the number of the magnetic domain wall movement elements 110 of the second circuit C2 or is larger than the number of the magnetic domain wall movement elements 110 of the second circuit C2. To one magnetic domain wall movement element 110, for example, a sum of outputs from a plurality of magnetic domain wall movement elements 100 connected to a read line RL connected to the magnetic domain wall movement element 110 is input.

Each of the first circuit C1 and the second circuit C2 includes a plurality of first switching elements SW1, a plurality of second switching elements SW2, a plurality of third switching elements SW3, a plurality of write lines WL, a plurality of read lines RL, and a plurality of common lines CL.

In the first circuit C1, for example, the magnetic domain wall movement elements 100 are arranged in a matrix pattern. In the second circuit C2, for example, the magnetic domain wall movement elements 110 are arranged in a matrix pattern. One magnetic domain wall movement element 100 or 110 is connected to one first switching element SW1, one second switching element SW2, and one third switching element SW3. Any one of the first switching elements SW1, the second switching elements SW2, and the third switching elements SW3 may be connected to a plurality of magnetic domain wall movement elements 100 or 110.

When the first switching element SW1 and the second switching element SW2 connected to a specific magnetic domain wall movement element 100 or 110 are turned on, data is written into the specific magnetic domain wall movement element 100 or 110. The data is recorded as a resistance value of the magnetic domain wall movement elements 100 or 110 in the stacking direction. In addition, when the second switching element SW2 and the third switching element SW3 connected to a specific magnetic domain wall movement element 100 or 110 are turned on, data written in the specific magnetic domain wall movement element 100 or 110 is read.

In a case in which data is read from the magnetic domain wall movement element 100 or 110, a current is caused to flow from the read line RL to the common line CL. A current (output value) output from the common line CL differs in accordance with a resistance value of the magnetic domain wall movement element 100 or 110 or a conductance value (a weight) that is a reciprocal of the resistance value. In other words, application of a current from the read line RL to the common line CL corresponds to a product operation in a neural network NN. The common line CL is connected to a plurality of magnetic domain wall movement elements 100 or 110 belonging to the same column, and a current detected at an end of the common line CL has a value acquired by performing a sum operation of results of product operations performed by the magnetic domain wall movement elements 100 or 110. Thus, the integrated device ID functions as a product/sum operator of the neural network NN.

Each current applied to the read line RL of the integrated device ID is an input to the product/sum operator, and a current output from each common line CL of the integrated device ID is an output from the product/sum operator. Input signals to the product/sum operator may be controlled using a pulse length, a pulse amplitude, or a pulse frequency.

Each of the first switching element SW1, the second switching element SW2, and the third switching element SW3 is, for example, a field effect transistor. Each of the first switching element SW1, the second switching element SW2, and the third switching element SW3, for example, may be an element using a phase change of a crystal layer such as an ovonic threshold switch (OTS), an element using a change in the band structure such as a metal insulator transition (MIT) switch, an element using a breakdown voltage such as a Zener diode or an avalanche diode, or an element of which conductivity changes in accordance with a change in the atom position.

The first switching element SW1 is connected to the write line WL. The second switching element SW2 is connected to the common line CL. The third switching element SW3 is connected to the read line RL. The read line RL is a wiring through which a current flows when reading data. The write line WL is a wiring through which a current flows when writing data. The common line CL is a wiring through which a current flows at both of the time of writing data and the time of reading data.

Figure 4:
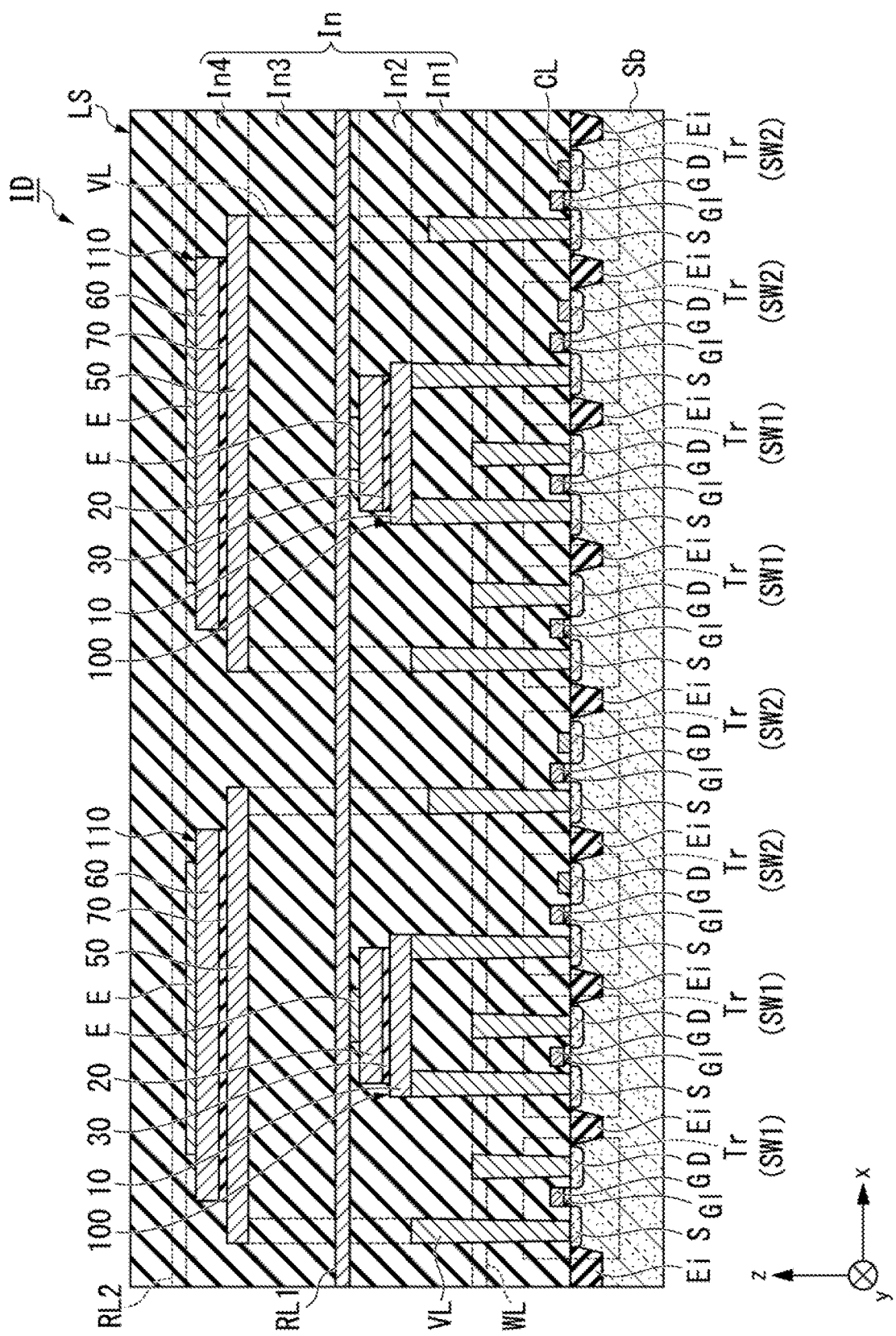
FIG. 4 is a cross-sectional view of feature parts of an integrated device used in the neuromorphic device according to the first embodiment.
Figure 5:
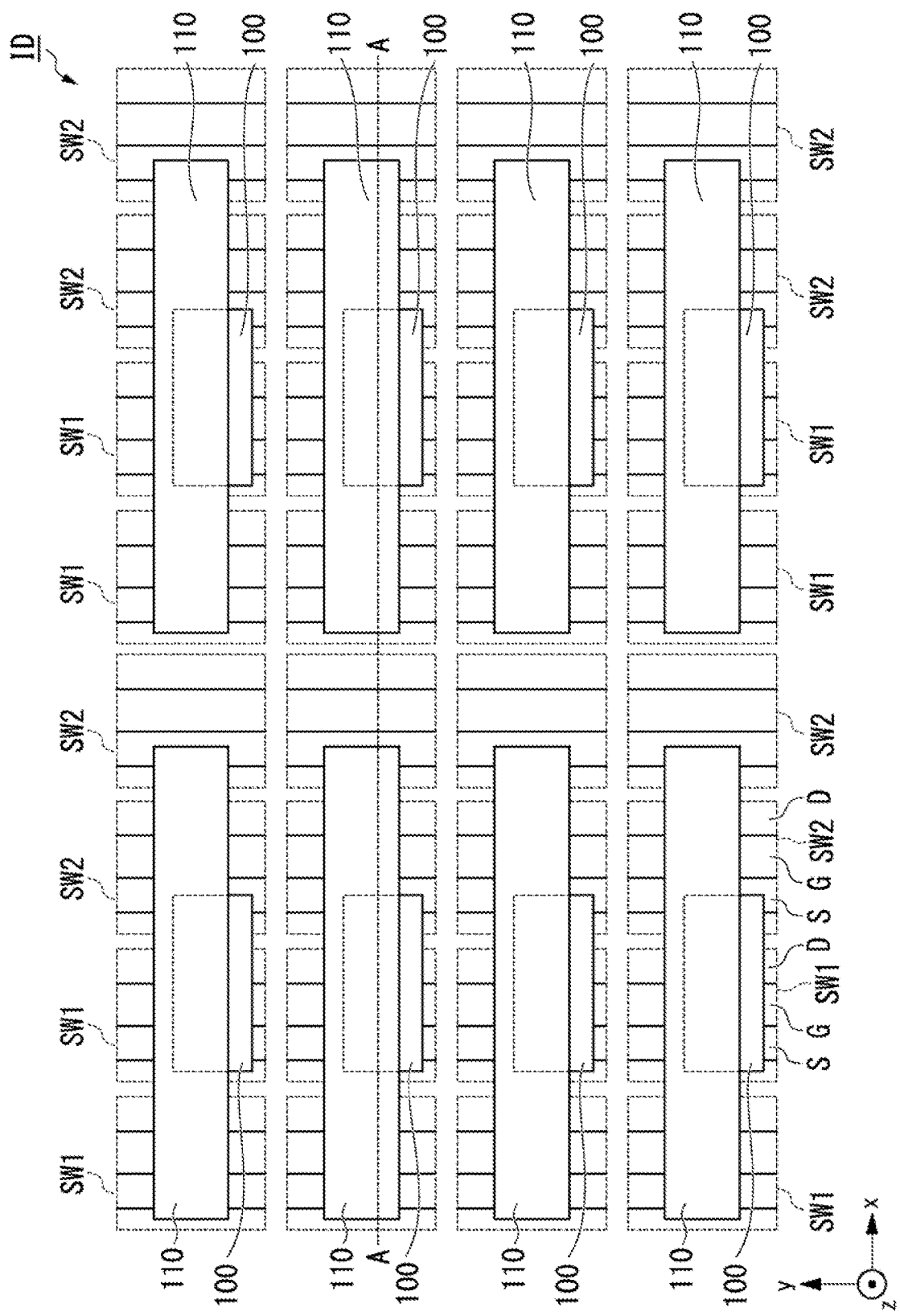
FIG. 5 is a plan view of feature parts of an integrated device used in the neuromorphic device according to the first embodiment.
Figure 6:
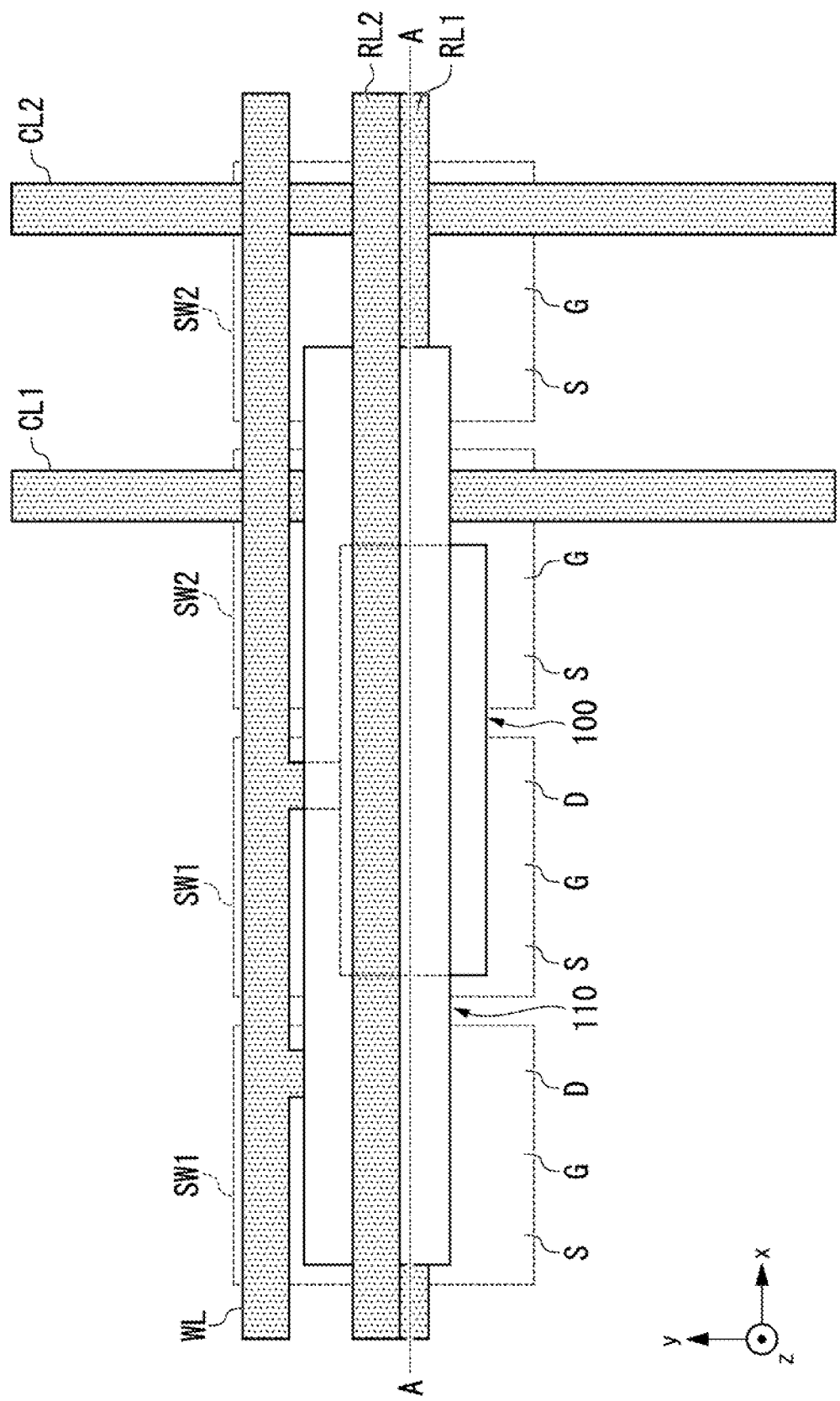
FIG. 6 is an enlarged plan view of the vicinity of two magnetic domain wall movement elements of the integrated device used in the neuromorphic device according to the first embodiment.
Figure 7:
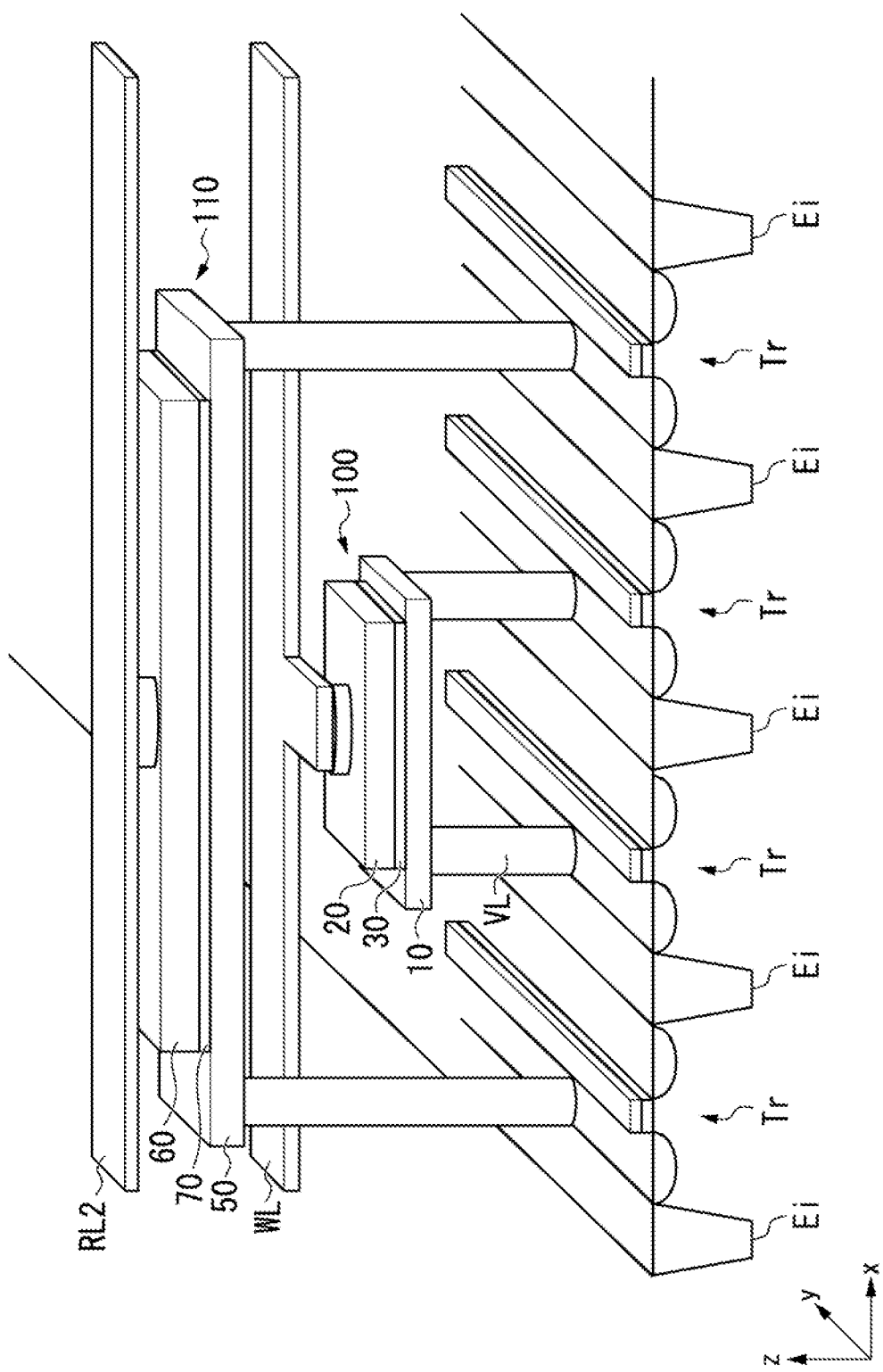
FIG. 7 is a perspective view of feature parts of the integrated device used in the neuromorphic device according to the first embodiment.

FIG. 4 is a cross-sectional view of feature parts of the integrated device ID according to the first embodiment. FIG. 5 is a plan view of feature parts of the integrated device ID according to the first embodiment. FIG. 5 is illustrated with the read lines RL, the write lines WL, and the common lines CL excluded. FIG. 6 is an enlarged plan view of the vicinity of two magnetic domain wall movement elements 100 and 110 of the integrated device ID according to the first embodiment. FIG. 4 is an xz cross-section cut along line A-A illustrated in FIGS. 5 and 6. FIG. 7 is a perspective view of feature parts of the integrated device ID. FIG. 7 is illustrated with an insulator In excluded.

The integrated device ID includes a substrate Sb and a laminated structural body LS. The laminated structural body LS is on top of the substrate Sb.

The substrate Sb is, for example, a semiconductor substrate. The substrate Sb includes a plurality of switching elements. The plurality of switching elements are insulated from each other by inter-element insulators Ei. The plurality of switching elements control the magnetic domain wall movement elements 100 and 110.

The plurality of switching elements are, for example, first switching elements SW1 and second switching elements SW2. Third switching elements SW3 are, for example, present at different positions in the y direction. The third switching elements SW3 are, for example, in a peripheral area outside an integration area in which the magnetic domain wall movement elements 100 and 110 are integrated. Hereinafter, a case in which the first switching element SW1 and the second switching element SW2 are disposed in a matrix pattern inside the integrated area will be described as an example.

Each of the first switching element SW1 and the second switching element SW2 is, for example, a field effect transistor Tr. Hereinafter, the first switching element SW1 and the second switching element SW2 may be simply referred to as transistors Tr without distinguishing them from each other.

The transistors Tr are, for example, aligned in a matrix pattern. The transistor Tr, for example, has a gate G, a gate insulating film GI, a source S, and a drain D. The gate G is between the source S and the drain D when seen in the z direction. The gate G controls the flow of electric charge between the source S and the drain D. The source S and the drain D are named in accordance with current flowing directions, and their positions change in accordance with a current flowing direction. The positional relation between the source S and the drain D illustrated in the drawings is an example, and the positional relation between the source S and the drain D of each transistor Tr may be the opposite.

The laminated structural body LS includes a first element group, a second element group, wirings, and an insulator In. The first element group has a plurality of magnetic domain wall movement elements 100. The second element group has a plurality of magnetic domain wall movement elements 110. The first element group and the second element group are in different hierarchical layers. The second element group is at a position further away from the substrate Sb than the first element group. The first element group, for example, forms the first circuit C1 and performs a first multiply/accumulate operation. The second element group, for example, forms the second circuit C2 and performs a second multiply/accumulate operation. In other words, the first element group and the second element group are, for example, responsible for calculations between different consecutive hierarchical layers of the neural network NN illustrated in FIG. 2. For example, the first element group is responsible for a calculation of a hierarchical layer closer to the input layer $L_{in}$ than the second element group.

The hierarchical layers are layers that are divided for respective functions. The laminated structural body LS is produced by repeating a lamination process and a working process, and a unit laminated in each lamination process frequently becomes a hierarchical layer. In the laminated structural body LS, for example, a wiring layer including an in-plane wiring and an element layer including magnetic domain wall movement elements are alternately laminated. The element layer may be composed of an arbitrary number of two or more layers.

A plurality of the magnetic domain wall movement elements 100 and 110 and the wirings are inside the insulator In. The insulator In is formed for each hierarchical layer. The insulator In is, for example, divided into insulators In1, In2, In3, and In4 for respective hierarchical layers. The insulator In insulates wirings and elements of a multi-layer wiring from each other. The insulator In is, for example, made of silicon oxide ($SiO_x$), silicon nitride ($SiN_x$), silicon carbide (SiC), chromium nitride, silicon carbide nitride (SiCN), silicon oxynitride (SiON), aluminum oxide ($Al_2O_3$), zirconium oxide ($ZrO_x$), or the like.

The wiring has conductivity. The wiring, for example, contains any one selected from the group consisting of Ag, Cu, Co, Al, Au, and Ru. As the wirings, there are in-plane wirings and via wirings VL. The in-plane wiring is a wiring that extends in one direction within an xy plane. The via wiring VL is a wiring that extends in the z direction. The via wiring VL, for example, connects elements in different hierarchical layers. The via wiring VL may be a through wiring that passes through an adjacent hierarchical layer and reaches another hierarchical layer or a substrate having the adjacent hierarchical layer interposed therebetween. The through wiring, for example, connects each of the magnetic domain wall movement elements 100 and 110 and the transistor Tr of the substrate Sb and passes through a part of the insulator in in the z direction. The through wiring is, for example, continuous in the z direction.

For example, the read lines RL, the write lines WL, and the common lines CL, wirings connecting these and the via wirings VL, and wirings connecting the via wirings VL are in-plane wirings. The in-plane wiring is, for example, in a hierarchical layer between the substrate Sb and the first element group and a hierarchical layer between the first element group and the second element group. The read lines RL, for example, extend in the x direction. For example, as the read lines RL, there are read lines RL1 connected to the magnetic domain wall movement elements 100 and read lines RL2 connected to the magnetic domain wall movement elements 110. The read lines RL1 and RL2 are, for example, connected to the ferromagnetic layers 20 and 60 of the magnetic domain wall movement elements 100 and 110 through electrodes EL. The write lines WL, for example, extend in the x direction. The write line WL is, for example, connected to the via wiring VL that reaches the transistor Tr through a wiring extending in the y direction. The common lines CL, for example, extend in the y direction.

The laminated structural bodies LS of the magnetic domain wall movement element 100 and the magnetic domain wall movement element 110 are in different hierarchical layers. The magnetic domain wall movement elements 100 are in the first hierarchical layer, and the magnetic domain wall movement elements 110 are in the second hierarchical layer. For example, each of the magnetic domain wall movement elements 100 and the magnetic domain wall movement elements 110 is connected to one of transistors Tr of the substrate Sb. For example, the transistors Tr that are adjacent to each other in the x direction are connected to the magnetic domain wall movement elements 100 and 110 of different hierarchical layers. For example, the transistors Tr that are adjacent to each other in the x direction are connected to the magnetic domain wall movement elements 100 and 110 of different hierarchical layers. For example, the transistors Tr of the second column and the third column aligned in the x direction control the magnetic domain wall movement elements 10W, and the transistors Tr of the first column and the fourth column control the magnetic domain wall movement elements 110.

Figure 8:
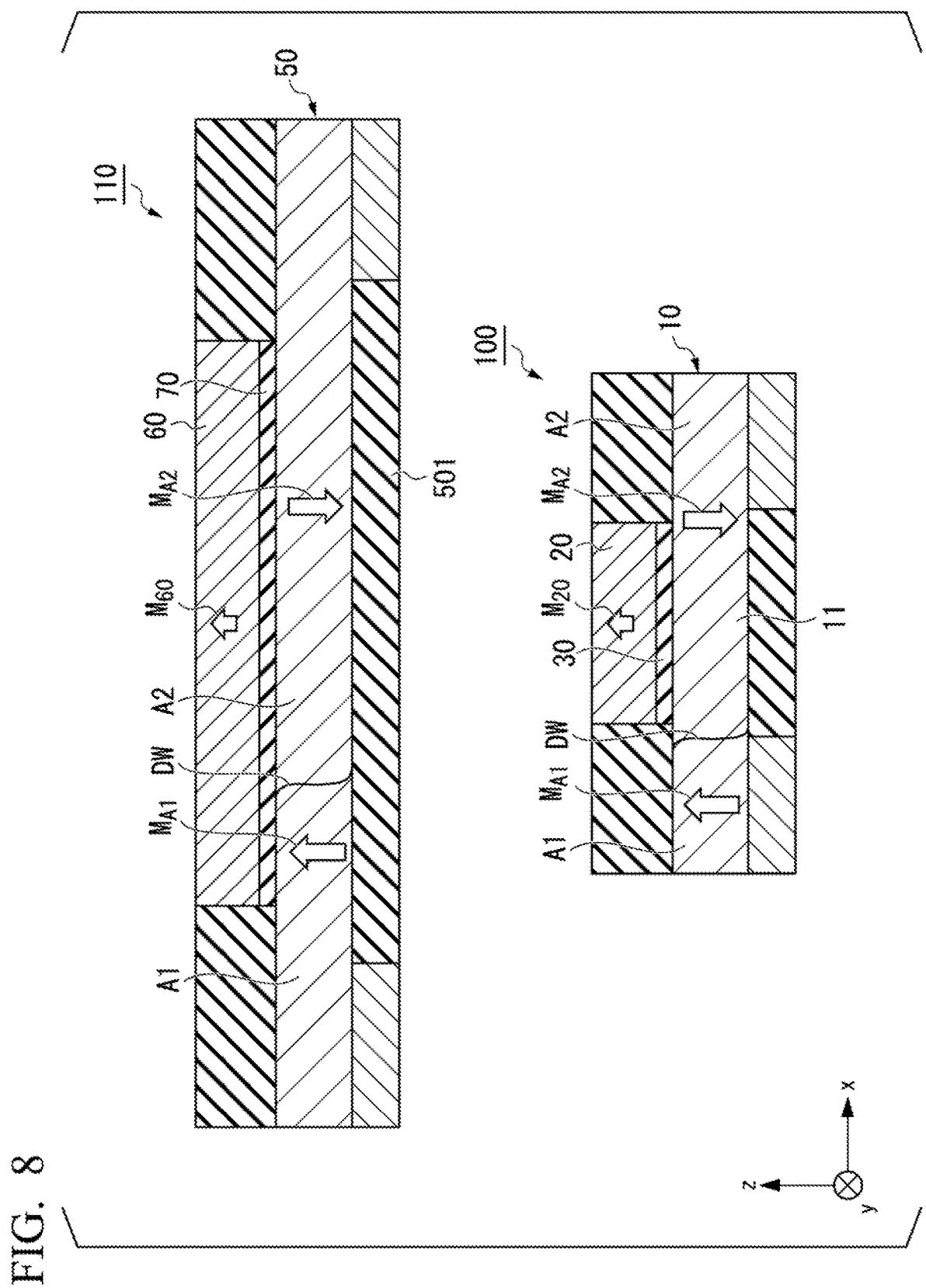
FIG. 8 is a cross-sectional view of a magnetic domain wall movement element belonging to a first element group and a magnetic domain wall movement element belonging to a second element group in the integrated device used in the neuromorphic device according to the first embodiment.

FIG. 8 is a cross-sectional view of a magnetic domain wall movement elements 100 and 110 included in the integrated device ID according to the first embodiment. FIG. 8 is a cross-section of the magnetic domain wall movement elements 100 and 110 taken along an xz plane passing through the center of the width of magnetic domain wall movement layers 10 and 50 in the y direction.

As illustrated in FIGS. 4 to 7, the magnetic domain wall movement elements 100 and 110 are, for example, integrated in the integrated device ID. The length of the magnetic domain wall movement element 100 is shorter than that of the magnetic domain wall movement element 110 in the x direction. For this reason, both ends of the magnetic domain wall movement element 100 in the x direction are disposed to be on the inner side of both ends of the magnetic domain wall movement element 110 in the x direction. When seen in the z direction, the magnetic domain wall movement element 110 at least partially overlaps the magnetic domain wall movement element 100.

The magnetic domain wall movement element 100 has a magnetic domain wall movement layer 10, a non-magnetic layer 30, and a ferromagnetic layer 20. The magnetic domain wall movement layer 10, for example, is arranged on the substrate Sb side from the ferromagnetic layer 20. The magnetic domain wall movement element 110 has a magnetic domain wall movement layer 50, a non-magnetic layer 70, and a ferromagnetic layer 60. The magnetic domain wall movement layer 50 is, for example, arranged on the substrate Sb side from the ferromagnetic layer 60. Each of the magnetic domain wall movement elements 100 and 110 is a magnetoresistance effect element of a three-terminal type and has a length in the x direction larger than a length in the y direction. The magnetic domain wall movement elements 100 and 110 have different lengths in the x direction. The magnetic domain wall movement element 110 has a length in the x direction larger than the magnetic domain wall movement element 100. The other configurations and shapes of the magnetic domain wall movement element 100 and the magnetic domain wall movement element 110 are approximately the same.

Each of the magnetic domain wall movement layers 10 and 50 extends in the x direction. Each of the magnetic domain wall movement layers 10 and 50, for example, has a rectangular shape having a long axis in the x direction and a short axis in the y direction in the plan view from the z direction. The magnetic domain wall movement layers 10 and 50 respectively face the ferromagnetic layers 20 and 60 with the non-magnetic layers 30 and 70 interposed therebetween. Each of the magnetic domain wall movement layers 10 and 50 has a first end connected to the first switching element SW1 and a second end connected to the second switching element SW2.

Each of the magnetic domain wall movement layers 10 and 50 includes a ferromagnetic substance. Each of the magnetic domain wall movement layers 10 and 50 is a layer in which information can be magnetically recorded in accordance with a change in the magnetic state of the inside. Each of the magnetic domain wall movement layers 10 and 50 can have a first magnetic domain A1 and a second magnetic domain A2 having different magnetic states. Magnetization $M_{A1}$ of the first magnetic domain A1 and magnetization $M_{A2}$ of the second magnetic domain A2 are, for example, oriented in opposite directions. For example, the magnetization MA1 of the first magnetic domain A1 is oriented in the +z direction, and the magnetization MA2 of the second magnetic domain A2 is oriented in the −z direction. A boundary between the first magnetic domain A1 and the second magnetic domain A2 is a magnetic domain wall DW. Each of the magnetic domain wall movement layers 10 and 50 can have the magnetic domain wall DW inside. When a current equal to or higher than a critical current density of each of the magnetic domain wall movement layers 10 and 50 flows in the longitudinal direction of each of the magnetic domain wall movement layers 10 and 50, the magnetic domain wall DW moves.

When the magnetic domain wall DW moves, a ratio between the first magnetic domain A1 and the second magnetic domain A2 in each of the magnetic domain wall movement layers 10 and 50 changes. By causing a write current to flow through each of the magnetic domain wall movement layers 10 and 50 in the x direction, the magnetic domain wall DW moves. When a ratio between the first magnetic domain A1 and the second magnetic domain A2 in each of the magnetic domain wall movement layers 10 and 50 changes, a resistance value of each of the magnetic domain wall movement elements 100 and 110 changes. The resistance values of the magnetic domain wall movement elements 100 and 110 change in accordance with relative angles of magnetization of the ferromagnetic layers having the non-magnetic layer 30 and 70 interposed therebetween. The resistance values of the magnetic domain wall movement elements 100 and 110 change in accordance with relative angles between the magnetization $M_{A1}$ and $M_{A2}$ of the magnetic domain wall movement layers 10 and 50 and the magnetization $M_{20}$ and $M_{60}$ of the ferromagnetic layers 20 and 60.

In other words, the resistance value of each of the magnetic domain wall movement elements 100 and 110 respectively depends on a ratio between the first magnetic domain A1 and the second magnetic domain A2 in each of the magnetic domain wall movement layers 10 and 50 and a relative angle between magnetization MA1 or $M_{A2}$ of each of the magnetic domain wall movement layers 10 and 50 and magnetization $M_{20}$ or $M_{60}$ of each of the ferromagnetic layers 20 and 60.

When the ratio of the first magnetic domain A1 becomes higher, the resistance values of the magnetic domain wall movement elements 100 and 110 become smaller. When the ratio of the first magnetic domain A1 is a maximum, the magnetization of the magnetic domain wall movement layers 10 and 50 and the magnetization $M_{20}$ and $M_{60}$ of the ferromagnetic layers 20 and 60 are in a parallel relation, and the resistance values of the magnetic domain wall movement elements 100 and 110 become minimum resistance values. When the ratio of the second magnetic domain A2 becomes higher, the resistance values of the magnetic domain wall movement elements 100 and 110 become larger. When the ratio of the second magnetic domain A2 is a maximum, the magnetization of the magnetic domain wall movement layers 10 and 50 and the magnetization $M_{20}$ and $M_{60}$ of the ferromagnetic layers 20 and 60 are in an antiparallel relation, and the resistance values of the magnetic domain wall movement elements 100 and 110 become maximum resistance values.

In accordance with a change in the position of the magnetic domain wall DW, the resistance values of the magnetic domain wall movement elements 100 and 110, for example, change in an analog manner. The resistance values of the magnetic domain wall movement elements 100 and 110 or the conductance values that are reciprocals of the resistance values correspond to weights of a transmission means in a neural network NN.

When a predetermined pulse is applied to the magnetic domain wall movement elements 100 and 110, a resistance changing rate of the magnetic domain wall movement element 100 is higher than a resistance changing rate of the magnetic domain wall movement element 110. In a case in which a resistance value when a predetermined pulse is input to a magnetic domain wall movement element having a resistance value R is R', the resistance changing rate P can be represented using the following Equation (1). Here, a maximum resistance value and a minimum resistance value of the magnetic domain wall movement element are respectively denoted by $R_{max}$ and $R_{min}$.

$$P=|R'-R|/(R_{max}-R_{min}) \quad (1)$$

Figure 9B:
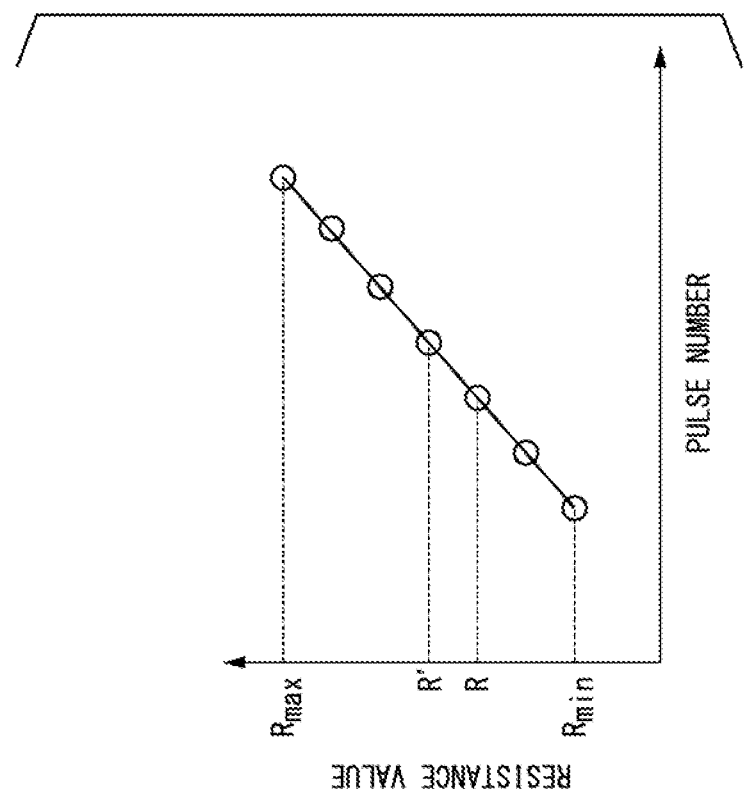
FIGS. 9A and 9B are image diagrams illustrating appearances of changes in a resistance value with respect to the pulse number applied to a magnetic domain wall movement element.
Figure 9A:
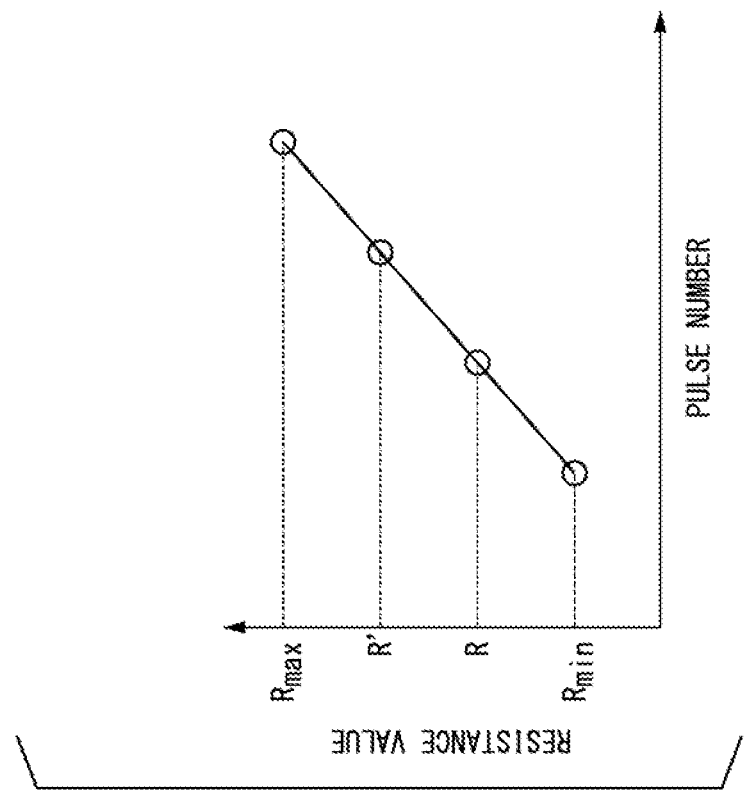

FIGS. 9A and 9B are image diagrams illustrating relations between the resistance values of the magnetic domain wall movement elements 100 and 110 and the numbers of pulses applied to the magnetic domain wall movement elements 100 and 110. Although the image diagrams in which the resistance values increase in accordance with pulse inputs are illustrated in FIG. 9 as an example, magnetic domain wall movement elements of which resistance values decrease in accordance with pulse inputs may be used in this embodiment. FIG. 9A is a graph relating to the magnetic domain wall movement element 100, and FIG. 9B is a graph relating to the magnetic domain wall movement element 110. While conductance values of the magnetic domain wall movement elements 100 and 110 linearly change with respect to the applied pulse number, the dynamic range is narrow, and thus, as illustrated in FIG. 9, the resistance values seem to linearly change. In this way, as the magnetic domain wall movement elements, magnetic domain wall movement elements of which resistance values non-linearly change with respect to the number of applied pulses may be used, or magnetic domain wall movement elements of which resistance values linearly change with respect to the number of applied pulses may be used. In FIG. 9, although a case in which a maximum resistance value $R_{max}$ and a minimum resistance value $R_{min}$ of the magnetic domain wall movement element 100 and a maximum resistance value $R_{max}$ and a minimum resistance value $R_{min}$ of the magnetic domain wall movement element 110 are the same is illustrated, they may be different from each other.

The magnetic domain wall movement layer 50 of the magnetic domain wall movement element 110 is longer than the magnetic domain wall movement layer 10 of the magnetic domain wall movement element 100 in a longitudinal direction. When a predetermined pulse is applied to the magnetic domain wall movement elements 100 and 110, the magnetic domain wall DW moves, and the ratio between the first magnetic domain A1 and the second magnetic domain A2 changes. The lengths of the magnetic domain wall movement layers 10 and 50 are different from each other, and thus, even in a case in which the amounts of movement of the magnetic domain walls DW are the same, a proportion of change in the ratio between the first magnetic domain A1 and the second magnetic domain A2 according to application of a predetermined pulse is different in the magnetic domain wall movement elements 100 and 110. In other words, the resistance changing rate of the magnetic domain wall movement element 100 after application of a predetermined pulse is higher than the resistance changing rate of the magnetic domain wall movement element 110. Here, the predetermined pulse is an arbitrary pulse equal to or higher than a critical current density of the magnetic domain wall movement layers 10 and 50. The critical current density is a current density that is necessary for moving the magnetic domain wall DW.

In this way, the resistance changing rate of the magnetic domain wall movement element 110 is lower than the resistance changing rate of the magnetic domain wall movement element 100, and thus the magnetic domain wall movement elements 110 can finely divide the resistance value. In other words, the magnetic domain wall movement element 110 has resolution higher than the magnetic domain wall movement element 100. By disposing the magnetic domain wall movement element 110 on the output layer $L_{out}$ side in the neural network NN, various weights can be applied to transmitted information.

The resolution can be adjusted using a pinning site. At a pinning site, it becomes difficult for the magnetic domain wall DW to move, and the magnetization $M_{A1}$ of the first magnetic domain and the magnetization $M_{A2}$ of the second magnetic domain are strongly fixed. A pinning site is, for example, unevenness of the magnetic domain wall movement layers 10 and 50. The magnetic domain wall movement layers 10 and 50 may include a plurality of pinning sites. From the point of view of increasing resolution, the magnetic domain wall movement layer 50 may include more pinning sites than the magnetic domain wall movement layer 10. For example, the surface roughness of a lower face 501 of the magnetic domain wall movement layer 50 may be higher than the surface roughness of a lower face 11 of the magnetic domain wall movement layer 10.

Each of the magnetic domain wall movement layers 10 and 50 is composed of a magnetic substance. Each of the magnetic domain wall movement layers 10 and 50 may be a ferromagnetic substance, a ferrimagnetic substance, or a combination of these and an anti-ferromagnetic substance that can change the magnetic state using a current. It is preferable that each of the magnetic domain wall movement layers 10 and 50 have at least one element selected from a group consisting of Co, Ni, Fe, Pt, Pd, Gd, Tb, Mn, Ge, and Ga. As materials used for each of the magnetic domain wall movement layers 10 and 50, for example, there are a laminated film of Co and Ni, a laminated film of Co and Pt, a laminated film of Co and Pd, a MnGa-based material, a GdCo-based material, and a TbCo-based material. A ferromagnetic substance such as the MnGa-based material, the GdCo-based material, and the TbCo-based material have low saturation magnetization, and a threshold current that is necessary for moving the magnetic domain wall DW is small. In addition, the laminated film of Co and Ni, the laminated film of Co and Pt, and the laminated film of Co and Pd have a large coercive force, and the moving speed of the magnetic domain wall is low. The antiferromagnetic substance is, for example, $Mn_3X$ (here, X is Sn, Ge, Ga, Pt, Ir, or the like), CuMnAs, $Mn_2Au$, or the like. The magnetic domain wall movement layers 10 and 50 may contain materials similar to materials of ferromagnetic layers 20 and 60 to be described later. In addition, the magnetic domain wall movement layers 10 and 50 may contain materials similar to the materials of ferromagnetic layers 20 and 60 to be described later. For example, the magnetic domain wall movement layers 10 and 50 may be laminated films of CO, Pd, and CoFeB.

The non-magnetic layer 30 is, for example, stacked on the magnetic domain wall movement layer 10. The non-magnetic layer 70 is, for example, stacked on the magnetic domain wall movement layer 50. The non-magnetic layers 30 and 70 are arranged respectively between the magnetic domain wall movement layers 10 and 50 and the ferromagnetic layers 20 and 60.

Each of the non-magnetic layers 30 and 70, for example, consist of a non-magnetic insulator, a semiconductor, or a metal. Examples of the non-magnetic insulator include $Al_2O_3$, $SiO_2$, MgO, $MgAl_2O_4$ and materials acquired by substituting parts of such Al, Si, and Mg with Zn, Be, and the like. Such materials have a large band gap and a superior insulating property. In a case in which the non-magnetic layers 30 and 70 are formed from a non-magnetic insulator, the non-magnetic layers 30 and 70 are tunnel barrier layers. Examples of the non-magnetic metal include Cu, Au, Ag, and the like. Examples of the non-magnetic semiconductor include Si, Ge, $CuInSe_2$, $CuGaSe_2$, $Cu(In,Ga)Se_2$.

It is preferable that the thickness of the non-magnetic layers 30 and 70 be equal to or larger than 20 Å, and it is more preferable that the thickness be equal to or larger than 30 Å. When the thicknesses of the non-magnetic layers 30 and 70 are large, the resistance area products (RA) of the magnetic domain wall movement elements 100 and 110 are large. It is preferable that the resistance area product (RA) of the magnetic domain wall movement elements 100 and 110 be equal to or larger than $1\times10^4$ $\Omega\mu m^2$, and it is more preferable that the resistance area product be equal to or larger than $1\times10^5$ $\Omega\mu m^2$. The resistance area product (RA) of the magnetic domain wall movement elements 100 and 110 is represented as a product of element resistance of one of the magnetic domain wall movement elements 100 and 110 and an element cross-sectional area (the area of a cut face of the non-magnetic layers 30 and 70 cut along the xy plane) of the magnetic domain wall movement elements 100 and 110.

The ferromagnetic layer 20 is arranged on the non-magnetic layer 30. The ferromagnetic layer 60 is on the non-magnetic layer 70. The ferromagnetic layer 20 has magnetization $M_{20}$ that is oriented in one direction. The ferromagnetic layer 60 has magnetization $M_{60}$ that is oriented in one direction. When a predetermined external force is applied, it is more difficult for the magnetization $M_{20}$ and $M_{60}$ of the ferromagnetic layers 20 and 60 to be reversed than the magnetization $M_{A1}$ and $M_{A2}$ of the first magnetic domain A1 and the second magnetic domain A2. Examples of the predetermined external force include an external force applied to magnetization in accordance with an external magnetic field and an external force applied to magnetization in accordance with a spin polarized current. The ferromagnetic layers 20 and 60 may be referred to as magnetization fixed layers or magnetization reference layers.

Each of the ferromagnetic layers 20 and 60 contains a ferromagnetic substance. The ferromagnetic layers 20 and 60, for example, contain a material from which a coherent tunnel effect can be easily acquired between the magnetic domain wall movement layers 10 and 50. Each of the ferromagnetic layers 20 and 60, for example, contains a metal selected from a group consisting of Cr, Mn, Co, Fe, and Ni, an alloy containing one or more kinds of such metals, an alloy containing such metals and at least one or more kinds of elements B, C, and N, and the like. Each of the ferromagnetic layers 20 and 60 is, for example, Co—Fe, Co—Fe—B, or Ni—Fe.

For example, each of the ferromagnetic layers 20 and 60 may be a Heusler alloy. The Heusler alloy is a half metal and has a high spin polarization ratio. The Heusler alloy is an inter-metal compound having a chemical composition of XYZ or $X_2YZ$. X is a transition metal element or a noble metal element of Co, Fe, Ni, or Cu group on a periodic table, Y is a transition metal of Mn, V, Cr, or T group or an element type of X, and Z is a typical element of group III to group V. Examples of the Heusler alloy include $Co_2FeSi$, $Co_2FeGe$, $Co_2FeGa$, CoMnSi, $Co_2Mn_{1-a}$—$Fe_aAl_b$ $Si_{1-c}Co_2FeGe_{1-c}Ga_c$, and the like.

On faces of the ferromagnetic layers 20 and 60 that are on a side opposite to the non-magnetic layers 30 and 70, a magnetic layer may be disposed through a spacer layer. The ferromagnetic layers 20 and 60, the spacer layer, and the magnetic layer form a synthetic antiferromagnetic structure (SAF structure). The synthetic antiferromagnetic structure consists of two magnetic layers having a non-magnetic layer interposed therebetween. At places at which the ferromagnetic layers 20 and 60 and the magnetic layer are antiferromagnetically coupled, the coercive forces of the ferromagnetic layers 20 and 60 are larger than that of case in which no magnetic layer is included. The magnetic layer, for example, contains a ferromagnetic substance and may contain an antiferromagnetic substance such as IrMn and PtMn. The spacer layer, for example, contains at least one selected from a group consisting of Ru, Jr, and Rh.

The direction of magnetization of each of the layers of the magnetic domain wall movement elements 100 and 110 can be checked, for example, by measuring a magnetization curve. The magnetization curve, for example, can be measured using a magneto optical Kerr effect (MOKE). The measurement using the MOKE is a measurement method performed using the magneto optical effect (magnetic Kerr effect) in which linear polarized light is caused to be incident to a measurement target object, and rotation and the like in a polarization direction thereof occur.

Next, a method of manufacturing the integrated device ID will be described. The integrated device ID is formed by a lamination process on each layer and a working process in which a part of each layer is processed into a predetermined shape. For the lamination of each layer, a sputtering method, a chemical vapor deposition (CVD) method, an electronic beam vapor deposition method (EB vapor deposition method), an atom laser deposition method, or the like can be used. The processing of each layer can be performed using photolithography or the like.

First, sources S and drains D are formed by doping impurities at predetermined positions in a substrate Sb. Next, a gate insulating film GI and a gate G are formed between each source S and each drain D. The source S, the drain D, the gate insulating film GI, and the gate G form a transistor Tr. As the substrate Sb, a semiconductor substrate that is commercially available in which transistors Tr are periodically disposed may be used.

Next, a wiring layer up to a first hierarchical layer is formed. The wiring layer can be manufactured using photolithography.

Next, a first element group of the first hierarchical layer is manufactured. First, a ferromagnetic layer, a non-magnetic layer, and a ferromagnetic layer are sequentially stacked, and these are processed into a predetermined shape. The ferromagnetic layer, the non-magnetic layer, and the ferromagnetic layer respectively form the magnetic domain wall movement layer 10, the non-magnetic layer 30, and the ferromagnetic layer 20. Also the first element group can be manufactured using the photolithography.

Next, in a similar procedure, by manufacturing a wiring layer between the first hierarchical layer and the second hierarchical layer and a second element group of the second hierarchical layer, an integrated device ID can be obtained. The second element group can be manufactured in a procedure similar to the first element group. By sequentially stacking a ferromagnetic layer, a non-magnetic layer, and a ferromagnetic layer and processing them in a predetermined shape, the ferromagnetic layer, the non-magnetic layer, and the ferromagnetic layer respectively become the magnetic domain wall movement layer 50, the non-magnetic layer 70, and the ferromagnetic layer 60.

The neuromorphic device having the configuration described above can integrate the magnetic domain wall movement elements 100 belonging to the first element group with a high density and increase the resolution of the magnetic domain wall movement elements 110 belonging to the second element group at the same time. In other words, according to the neuromorphic device of this embodiment, the integration becomes high, and the identification rate can be improved. In addition, as in the neuromorphic device according to this embodiment, an idea of bringing a variation in the configuration of each hierarchical layer by changing lengths of the magnetic domain wall movement elements 100 belonging to the first element group and the magnetic domain wall movement elements 110 belonging to the second element group in the x direction goes against conventional common technical knowledge of reducing a deviation of each hierarchical layer by using the same elements within an array or the like.

Furthermore, according to the neuromorphic device of this embodiment, by changing the length of the magnetic domain wall movement element 100 and the magnetic domain wall movement element 110, both ends of the magnetic domain wall movement element 100 in the x direction can be disposed on the inner side of both ends of the magnetic domain wall movement element 110 in the x direction. According to such a configuration, wirings that are necessary for operating the neuromorphic device can be easily formed. In addition, the number of magnetic domain wall movement elements 100 and 110 that can be housed inside a predetermined area increases. In other words, the integration of variable resistance elements of the integrated device ID can be increased.

In addition, a relation between the magnetic domain wall movement element 100 and the magnetic domain wall movement element 110 may be satisfied by all the magnetic domain wall movement elements 100 and 110 among the magnetic domain wall movement elements 100 and 110 or may be satisfied by some of the magnetic domain wall movement elements 100 and 110. For example, in the longitudinal direction of any of magnetic domain wall movement elements 110 belonging to the second element group, both ends of any of magnetic domain wall movement elements 100 belonging to the first element group may be disposed on the inner side of both ends of any of the magnetic domain wall movement elements 110 belonging to the second element group. In addition, any of magnetic domain wall movement elements 100 belonging to the first element group and any of magnetic domain wall movement elements 110 belonging to the second element group may at least partially overlap each other. Furthermore, in the example described above, although a configuration in which the longitudinal directions of all the magnetic domain wall movement elements 100 and 110 belonging to the first element group and the second element group are the x direction is illustrated in the drawing, the longitudinal direction of any of magnetic domain wall movement elements belonging to the first element group and the second element group may be a direction other than the x direction.

In addition, in the embodiment described above, although a case in which the number of the magnetic domain wall movement elements 100 belonging to the first element group and the number of the magnetic domain wall movement elements 110 belonging to the second element group are different from each other is illustrated, the number of the magnetic domain wall movement elements 100 belonging to the first element group and the number of the magnetic domain wall movement elements 110 belonging to the second element group may be the same.

In addition, a configuration in which a pulse length of a write pulse input to the magnetic domain wall movement elements 110 belonging to the second element group and a pulse length of a write pulse input to the magnetic domain wall movement elements 100 belonging to the first element group are different from each other at the time of operating the integrated device ID may be employed. For example, the pulse length of the write pulse input to the magnetic domain wall movement elements 110 may be configured to be longer than the pulse length of the write pulse input to the magnetic domain wall movement elements 100 belonging to the first element group.

In addition, a pulse amplitude of the write pulse input to the magnetic domain wall movement elements 110 belonging to the second element group may be configured to be different from a pulse amplitude of the write pulse input to the magnetic domain wall movement elements 100 belonging to the first element group. For example, the pulse amplitude of the write pulse input to the magnetic domain wall movement elements 110 may be configured to be higher than the pulse amplitude of the write pulse input to the magnetic domain wall movement elements 100.

By configuring the magnitude (the pulse length and the pulse amplitude) of the write pulse applied to the magnetic domain wall movement layer 50 to be different from the magnitude of the write pulse applied to the magnetic domain wall movement layer 10, the resolution of each hierarchical layer in the neuromorphic device can be accurately adjusted.

For example, by configuring the magnitude of the write pulse applied to the magnetic domain wall movement layer 50 to be large, the magnetic domain wall DW being trapped in a trap site can be inhibited. In other words, the reliability of the operation of the magnetic domain wall movement element 110 can be improved. The magnitude of the pulse is, for example, controlled by a write circuit connected to the integrated device ID.

Second Embodiment

Figure 10:
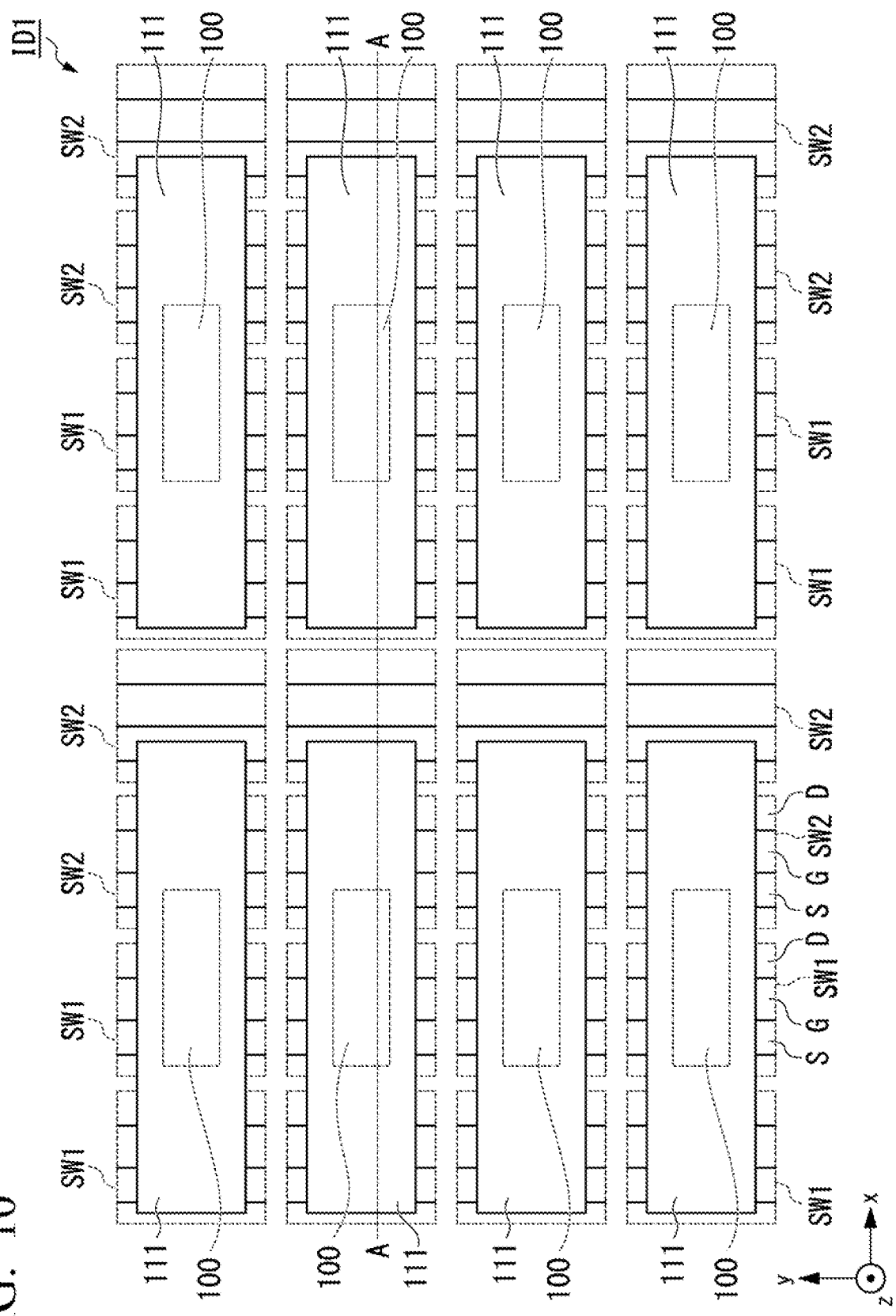
FIG. 10 is a plan view of feature parts of an integrated device used in a neuromorphic device according to a second embodiment.
Figure 11:
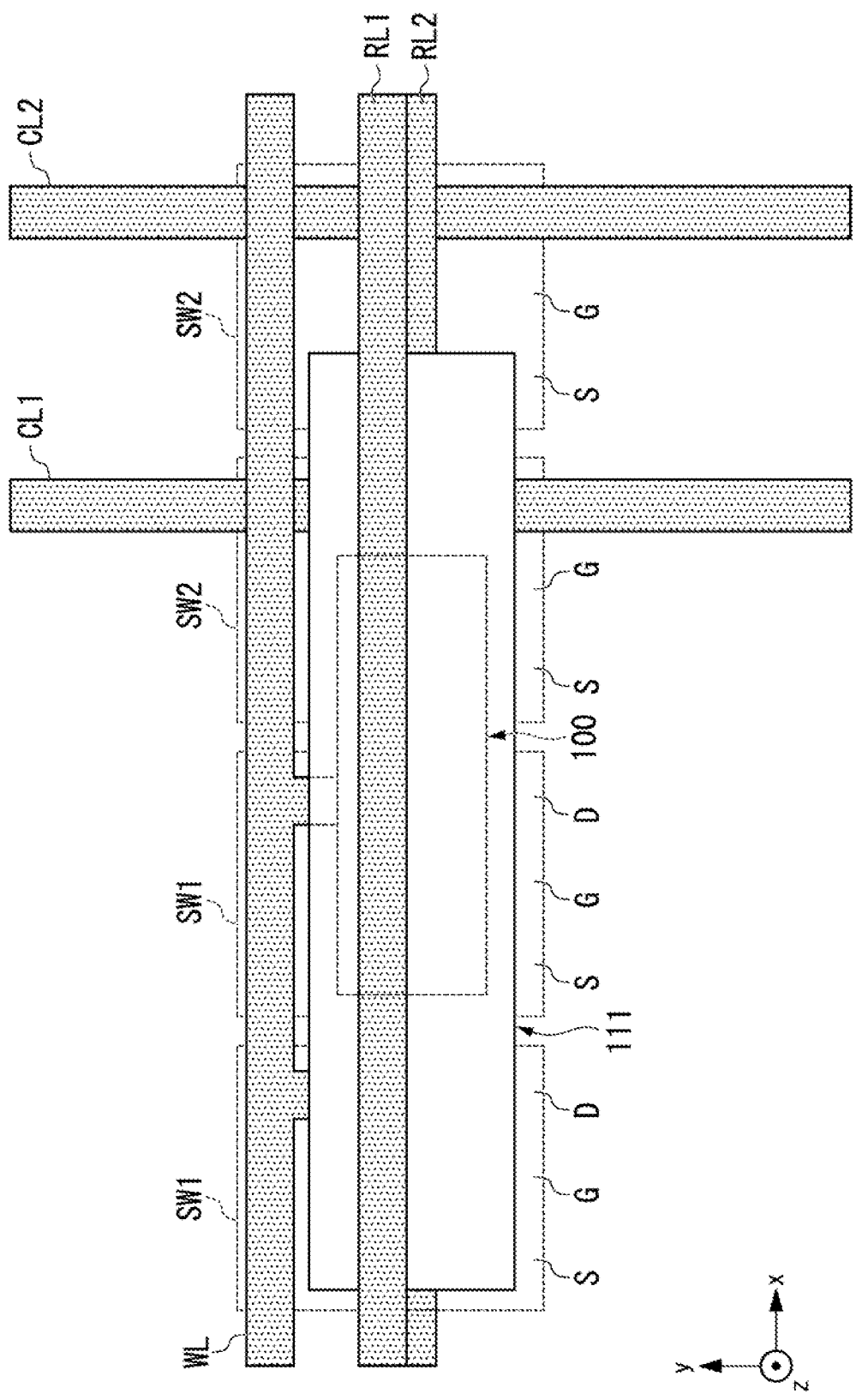
FIG. 11 is an enlarged plan view of the vicinity of two magnetic domain wall movement elements of the integrated device used in the neuromorphic device according to the second embodiment.
Figure 12:
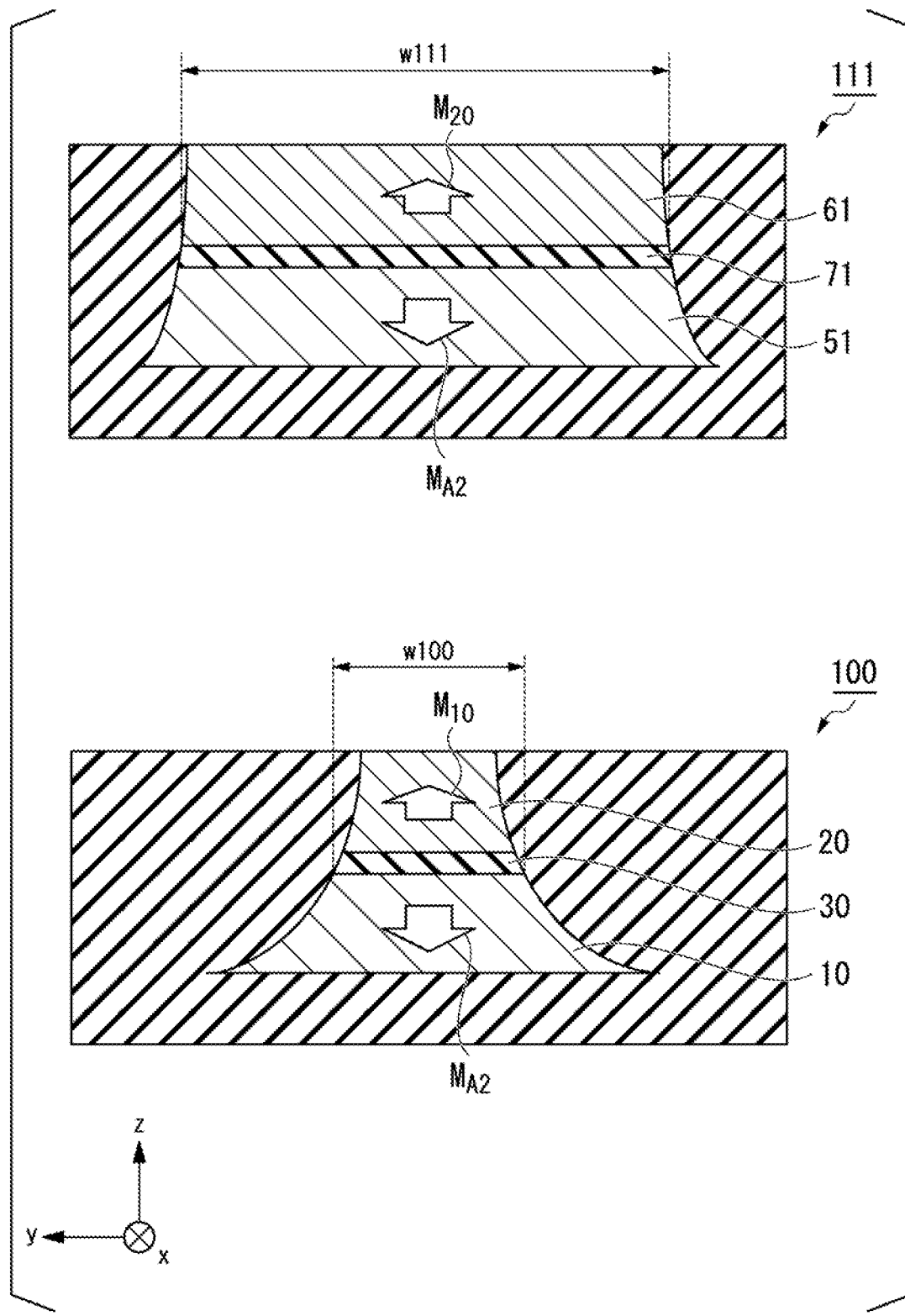
FIG. 12 is a cross-sectional view of a magnetic domain wall movement element belonging to a first element group and a magnetic domain wall movement element belonging to a second element group in the integrated device used in the neuromorphic device according to the second embodiment.

FIG. 10 is a plan view of an integrated device ID1 used in a neuromorphic device according to a second embodiment. FIG. 10 is illustrated with read lines RL, write lines WL, and common lines CL excluded. FIG. 11 is an enlarged cross-sectional view of the vicinity of a magnetic domain wall movement element 100 belonging to a first element group and a magnetic domain wall movement element 111 belonging to a second element group in the integrated device ID1 according to the second embodiment. FIG. 12 illustrates cross-sections of magnetic domain wall movement elements 100 and 111 cut along an yz plane passing through the centers of magnetic domain wall movement layers 10 and 51 in the x direction. In the neuromorphic device according to the second embodiment, a width $w_{111}$ of the magnetic domain wall movement element 111 is larger than a width $w_{100}$ of the magnetic domain wall movement element 100, which is different from the first embodiment. In the second embodiment, the same reference signs will be assigned to components similar to those according to the first embodiment, and description thereof will be omitted.

The magnetic domain wall movement element 111 has a magnetic domain wall movement layer 51, a non-magnetic layer 71, and a ferromagnetic layer 61. A length of the magnetic domain wall movement element 111 is different from a length of the magnetic domain wall movement element 110 in the y direction. The lengths of the magnetic domain wall movement layer 51, the non-magnetic layer 71, and the ferromagnetic layer 61 of the magnetic domain wall movement element 111 belonging to the second element group in the y direction are longer than the lengths of the magnetic domain wall movement layer 10, the non-magnetic layer 30, and the ferromagnetic layer of the magnetic domain wall movement element 100 belonging to the first element group in the y direction. In other words, the width w ill of the magnetic domain wall movement element 111 is longer than the width w100 of the magnetic domain wall movement element 100. Here, the width of a magnetic domain wall movement element represents an average of widths of an upper face of the magnetic domain wall movement layer and a lower face of the ferromagnetic layer.

The magnetic domain wall movement element 100 is covered with the magnetic domain wall movement element 111 when the integrated device ID1 is seen in the z direction.

The second element group is disposed on an output layer $L_{out}$ side of a neural network NN from the first element group. As described above, the number of the magnetic domain wall movement elements 111 belonging to the second element group may be smaller than the number of the magnetic domain wall movement elements 100 belonging to the first element group. In a case in which the number of the magnetic domain wall movement elements 111 belonging to the second element group is smaller than the number of the magnetic domain wall movement elements 100 belonging to the first element group, the number of magnetic domain wall movement elements 111 connected to one read line RL is smaller than the number of magnetic domain wall movement elements 100 connected to one read line RL. For this reason, a sum of outputs for one read line RL is smaller in the second element group than in the first element group. In a case in which a sum of outputs for one read line RL is undeterminably small, it may cause a learning error of the neuromorphic device.

In the neuromorphic device according to the second embodiment, the lengths of the magnetic domain wall movement layer 51, the non-magnetic layer 71, and the ferromagnetic layer 61 of the magnetic domain wall movement element 111 in the y direction are long, and thus a resistance value in the stacking direction can be configured to be small. In other words, a current flowing through the magnetic domain wall movement element 111 at the time of reading data can be configured to be large. For this reason, an output from the magnetic domain wall movement element 111 at the time of reading data can be configured to be large. Thus, a learning error in the neuromorphic device can be inhibited. In addition, also in the case of the neuromorphic device according to the second embodiment, effects similar to those of the neuromorphic device according to the first embodiment are acquired.

In addition, in FIGS. 10 to 12, a state in which the magnetic domain wall movement element 100 is covered with the magnetic domain wall movement element 111 when seen in the z direction is illustrated. By employing such an arrangement, the integration of the magnetic domain wall movement elements 100 and 111 in the integrated device ID1 can be increased. However, the arrangement of the magnetic domain wall movement elements 100 and the magnetic domain wall movement elements 111 is not limited to this example, and, as in the first embodiment, a configuration in which the magnetic domain wall movement element 100 overlaps the magnetic domain wall movement element 111 in a part may be employed. In addition, although an example in which the shapes of the yx cross-sections of the magnetic domain wall movement elements 100 and 111 are inclined is illustrated in FIG. 12, a configuration in which the shapes are not inclined may be employed.

Third Embodiment

Figure 13:
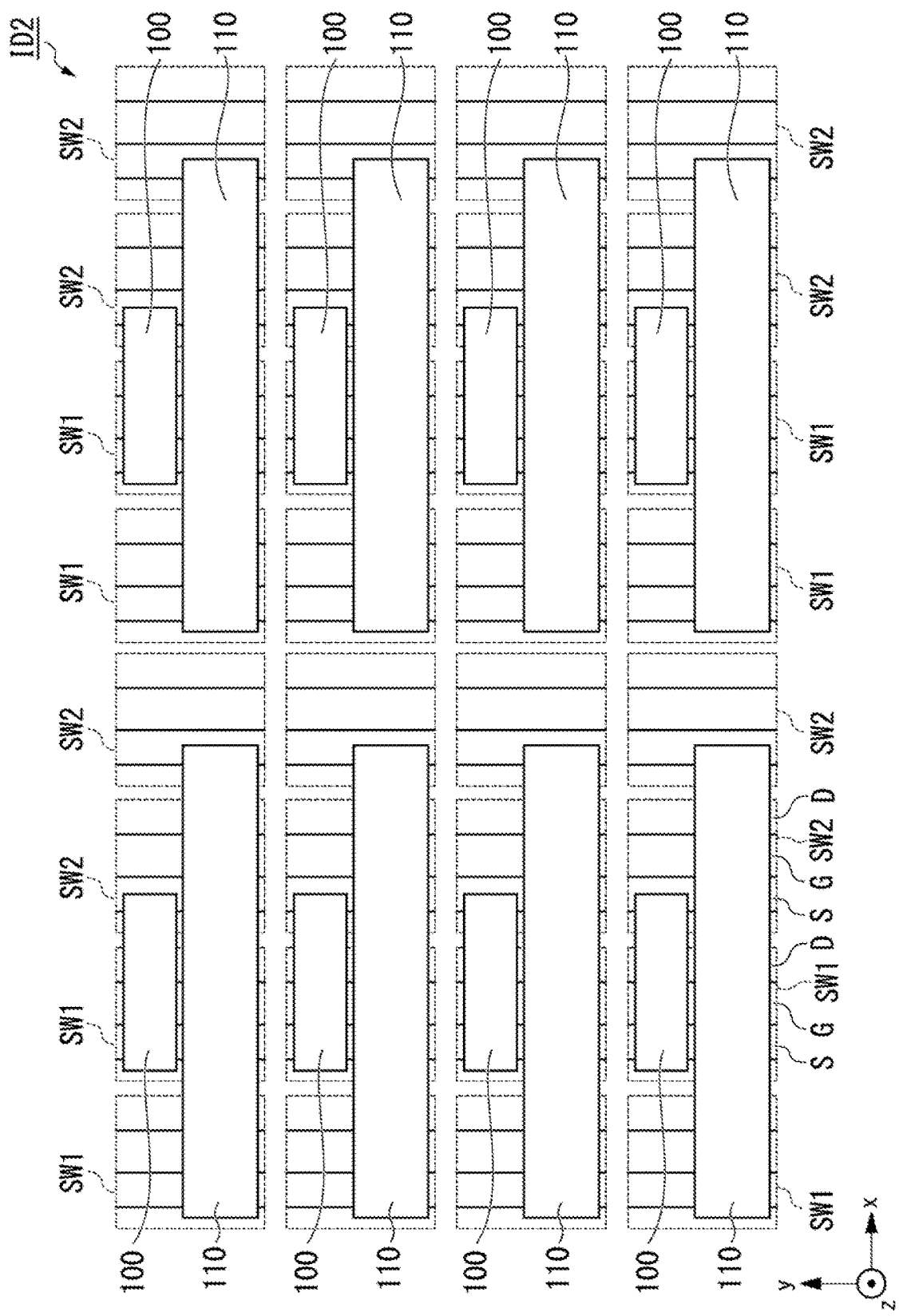
FIG. 13 is a plan view of feature parts of an integrated device used in a neuromorphic device according to a third embodiment.
Figure 14:
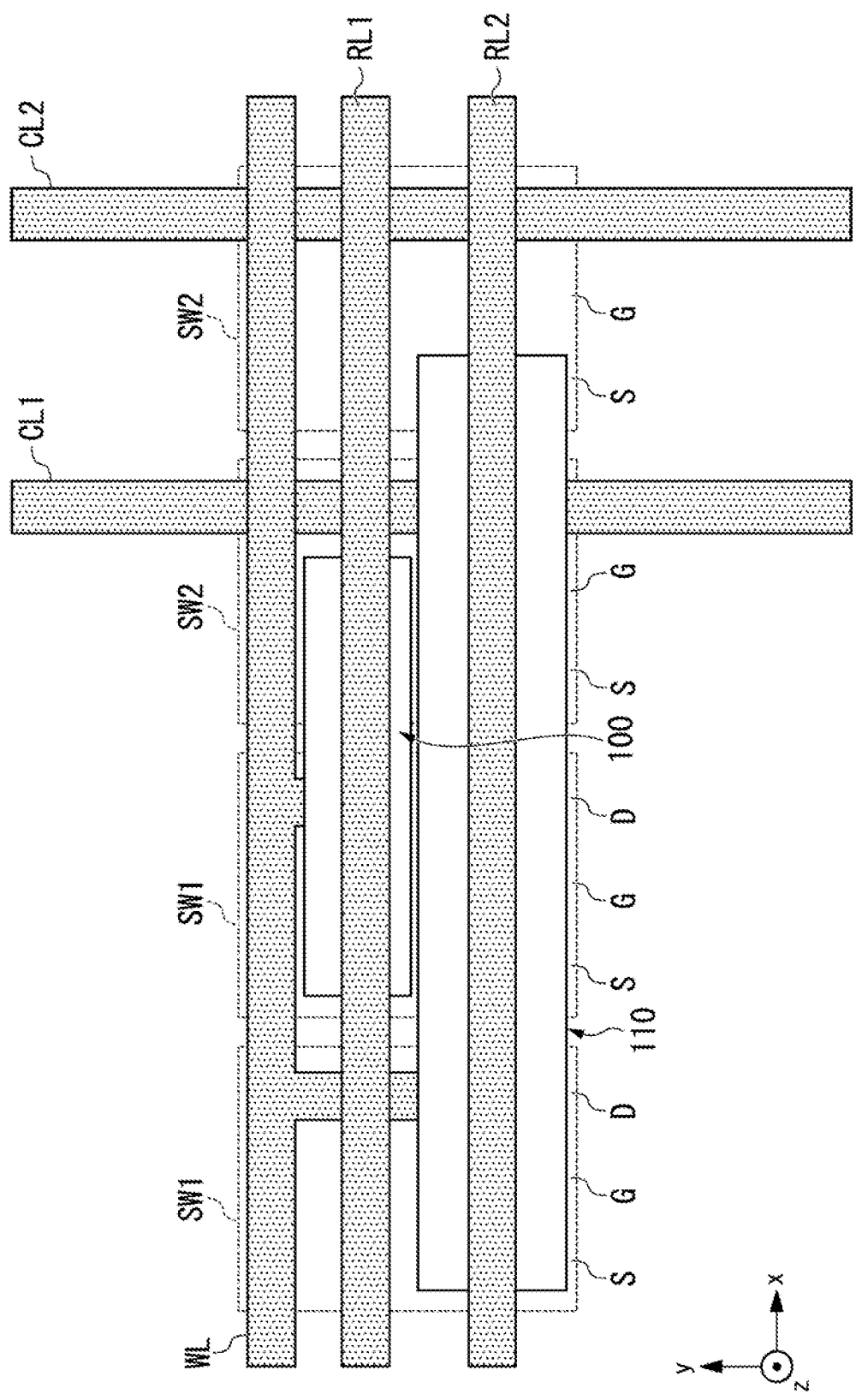
FIG. 14 is an enlarged plan view of the vicinity of two magnetic domain wall movement elements of the integrated device used in the neuromorphic device according to the third embodiment.

FIG. 13 is a plan view of an integrated device ID2 used in a neuromorphic device according to a third embodiment. FIG. 13 is illustrated with read lines RL, write lines WL, and common lines CL excluded. FIG. 14 is an enlarged plan view of the vicinity of two magnetic domain wall movement elements 100 and 110 of the neuromorphic device according to the third embodiment. In the neuromorphic device according to the third embodiment, the arrangement of the magnetic domain wall movement element 100 and the arrangement of the magnetic domain wall movement element 110 is different from that of the neuromorphic device according to the first embodiment. In the third embodiment, the same reference signs will be assigned to components similar to those according to the first embodiment, and description thereof will be omitted.

In this embodiment, magnetic domain wall movement elements 110 belonging to the second element group do not overlap magnetic domain wall movement elements 100 belonging to the first element group when seen in the z direction.

When various structural bodies are arranged in a lower layer of the magnetic domain wall movement elements 110, the flatness of a stacking face at the time of producing the magnetic domain wall movement element 110 is lowered. The reason for this is that the number of times of processing up to reach of a stacking face increases. By arranging the magnetic domain wall movement element 110 at a position not overlapping the magnetic domain wall movement element 100 when seen in the z direction, the flatness of the stacking face at the time of producing the magnetic domain wall movement element 110 can be raised.

When the flatness of the stacking face at the time of producing the magnetic domain wall movement element 110 is high, the flatness of the lower face of the magnetic domain wall movement layer 50 becomes high.

The neuromorphic device according to the third embodiment has effects similar to the neuromorphic device according to the first embodiment. In addition, by decreasing a difference of roughness between the magnetic domain wall movement layer 10 and 50, the reliability of a write operation is superior in the neuromorphic device according to the third embodiment.

Fourth Embodiment

Figure 15:
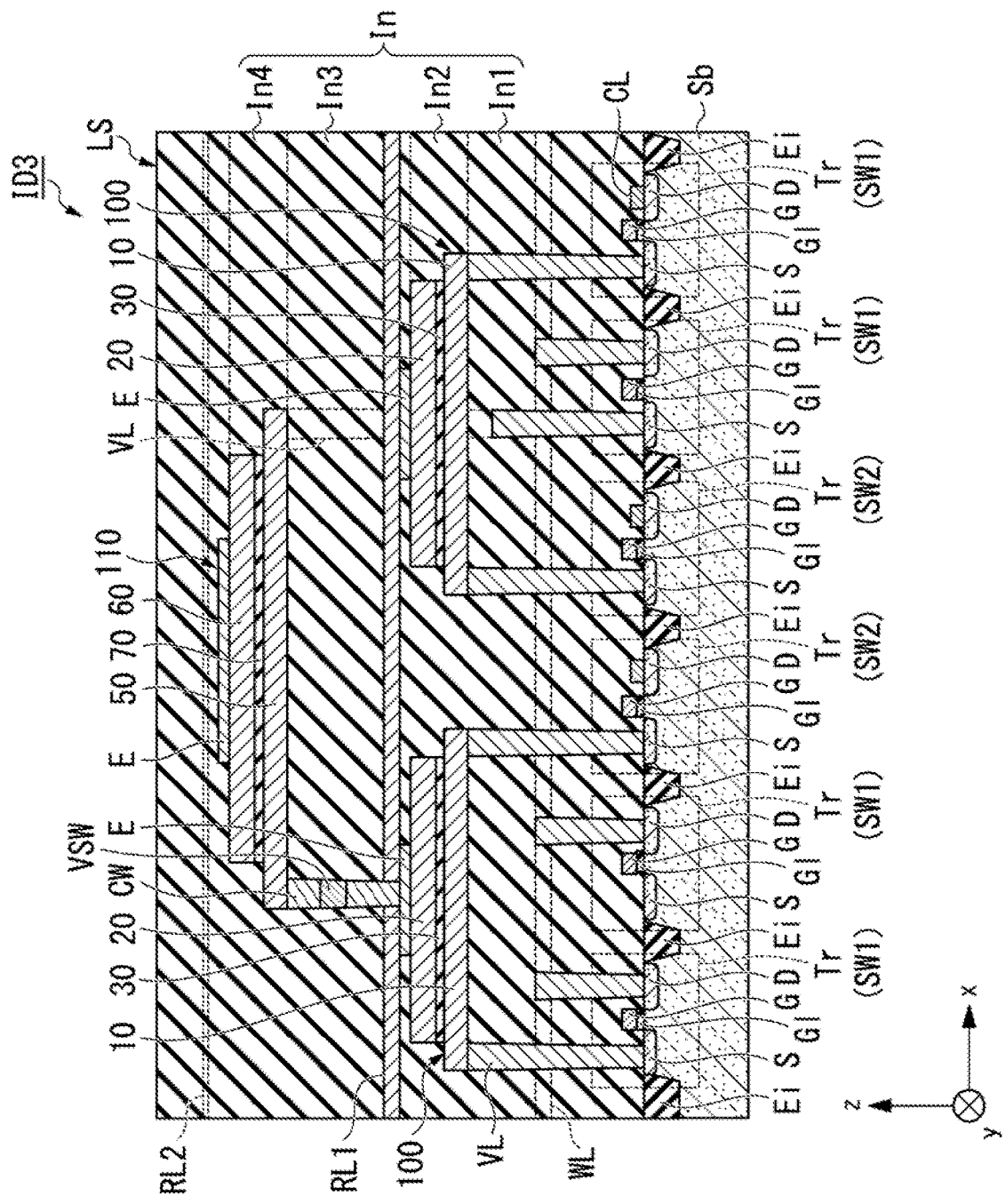
FIG. 15 is a cross-sectional view of feature parts of an integrated device used in a neuromorphic device according to a fourth embodiment.

FIG. 15 is a cross-sectional view of an integrated device ID3 used in a neuromorphic device according to a fourth embodiment. In FIG. 15, some of magnetic domain wall movement elements 100 and magnetic domain wall movement elements 110 are connected through a connection wiring CW. In the fourth embodiment, the same reference signs will be assigned to components similar to those according to the first embodiment, and description thereof will be omitted.

The magnetic domain wall movement element 100 is connected to a nearest contacting magnetic domain wall movement element 110 not electrically through a substrate Sb but through the connection wiring CW. Not all the magnetic domain wall movement elements 100 but any one of the magnetic domain wall movement elements needs to be connected to the magnetic domain wall movement element 110. For example, the ferromagnetic layer 20 of the magnetic domain wall movement element 100 is connected to the magnetic domain wall movement layer 50 of the magnetic domain wall movement element 110.

The connection wiring CW may have a vertical switching element VSW. The vertical switching element VSW is a switching element composed of lamination films stacked in the z direction. For example, an element using a phase change of a crystalline layer such as an ovonic threshold switch (OTS), an element using a change in the band structure such as a metal insulator transition (MIT) switch, an element using a breakdown voltage such as a Zener diode and an avalanche diode, and an element of which conductivity changes in accordance with a change in the atomic position are vertical switching elements VSW.

In a case in which the magnetic domain wall movement element 100 and the magnetic domain wall movement element 110 are connected using the connection wiring CW, a current path from the read line RL2 to the common line CL though the magnetic domain wall movement elements 100 and 110 is formed. In other words, combined resistance acquired by combining the resistance value of the magnetic domain wall movement element 100 and the resistance value of the magnetic domain wall movement element, 110 can be read. In a neuromorphic device, the resistance values of the magnetic domain wall movement elements 100 and 110 or the conductance values that are reciprocals of the resistance values correspond to weights. The current path described above can represent a new weight acquired by combining the weights of two magnetic domain wall movement elements 100 and 110. Thus, according to a neuromorphic device using an integrated device ID2 according to the fourth embodiment, three weights can be represented using two magnetic domain wall movement elements 100 and 110, and a more complex operation can be performed, whereby power of expression is improved.

Fifth Embodiment

In the embodiments described above, although a case in which the first element group and the second element group include magnetic domain wall movement elements has been illustrated, the present invention is not limited to this example. The first element group and the second element group may include other variable resistance elements. A neuromorphic device according to the fifth embodiment uses variable resistance elements other than the magnetic domain wall movement element 100 and the magnetic domain wall movement element 110 as variable resistance elements, which is different from the neuromorphic device according to the first embodiment. In addition, in the neuromorphic device according to the fifth embodiment, a length of variable resistance elements belonging to a first element group in the longitudinal direction may be configured to be longer than a length of variable resistance elements belonging to a second element group in the longitudinal direction, which is different from the neuromorphic device according to the first embodiment. Furthermore, in the neuromorphic device according to the fifth embodiment, a volume of a part contributing to a resistance change of a variable resistance element is preferably larger for the variable resistance element belonging to the second element group than for the variable resistance element belonging to the first element group. The other configurations are similar to the neuromorphic device according to the first embodiment, and thus detailed description thereof will be omitted.

The neuromorphic device according to the fifth embodiment includes a first element group and a second element group that include a plurality of variable resistance elements. In the neuromorphic device according to the fifth embodiment, a resistance changing rate when a predetermined pulse is input is higher for each variable resistance element belonging to the first element group than for each variable resistance element belonging to the second element group. Hereinafter, for the convenience of description, a variable resistance element belonging to the first element group will be referred to as a first variable resistance element, and a variable resistance element belonging to the second element group will be referred to as a second variable resistance element.

As each of the first variable resistance element and the second variable resistance element, an arbitrary element having a correlation between the number of applied pulses and a resistance value is used. As each of the first variable resistance element and the second variable resistance element, for example, an element using a phase change memory (PCM), a resistive random access memory (ReRAM), a carbon nanotube random access memory (NRAM), an element using a correlated electron random access memory (CeRAM) that uses a highly-correlated electronic system, or the like is used. The PCM controls a phase change between a crystal and a non-crystal in a stepped manner. The ReRAM uses a resistance change by forming a filament according to metal deposition in a medium such as $TaO_2$. The types of the variable resistance elements used as the first variable resistance element and the second variable resistance element may be the same or different from each other.

Figure 16:
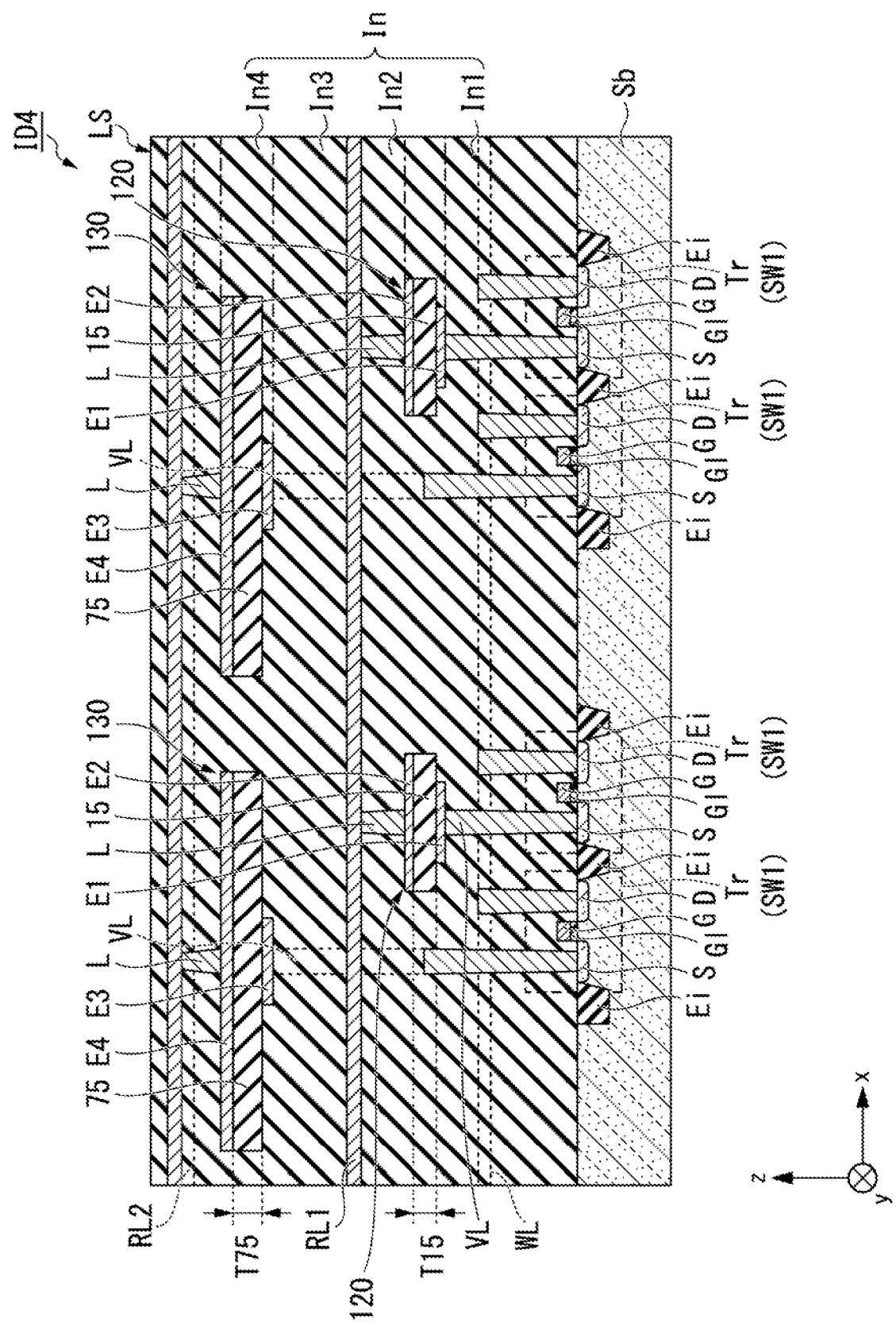
FIG. 16 is a cross-sectional view of feature parts of an integrated device used in a neuromorphic device according to a fifth embodiment.

FIG. 16 is an example of a cross-sectional view of the integrated device ID4 used in the neuromorphic device according to the fifth embodiment. The neuromorphic device according to the fifth embodiment includes variable resistance elements 120 and 130 composed of phase change memories, which is different from the neuromorphic device according to the first embodiment. The variable resistance element 120 is, for example, the first variable resistance element present in a first hierarchical layer, and the variable resistance element 130 is, for example, the second variable resistance element present in a second hierarchical layer.

Different from the magnetic domain wall movement elements 100 and 110 according to the first embodiment, the variable resistance elements 120 and 130 are elements of a two-terminal type. The variable resistance elements 120 and 130, for example, respectively include lower electrodes E1 and E3, functional layers 15 and 75, and upper electrodes E2 and E4 overlapping in the stacking direction. The lower electrodes E1 and E3 are connected to via wirings VL. The upper electrodes E2 and E4 of the variable resistance elements 120 and 130 are connected to wirings L. The lower electrodes E1 and E3 and the via wirings VL may be integrally formed, and the upper electrodes E2 and E4 and the wirings L may be integrally formed.

The variable resistance element 130 is, for example, disposed at a position further away from the substrate Sb than the variable resistance element 120. At least a part of the variable resistance element 120, for example, overlaps the variable resistance element 130. All the ends of the variable resistance element 120 may be disposed on all the inner sides of the variable resistance element 130 on a plan view in the z direction. In such a configuration, both ends of the variable resistance element 120 in the longitudinal direction are on the inner sides of both ends of the variable resistance element 130 in the longitudinal direction. For example, more variable resistance elements 120 than the variable resistance elements 130 may be provided.

Each of the functional layers 15 and 75 contains chalcogenide such as Ge—Sb—Te. Each of the functional layers 15 and 75 is, for example, composed of chalcogenide. When a large current is caused to flow through the functional layers 15 and 75 by applying a high voltage thereto, the functional layers 15 and 75 are Joule-heated, and when they are over a melting point, areas of over the melting point are melted. Thereafter, when the voltage is rapidly lowered, the functional layers 15 and 75 are rapidly cooled, and the areas melted through Joule heating change from a crystalline state to an amorphous state and have increased resistance values (a resetting operation). Here, the areas of the lower electrodes E1 and E3 that change from the crystalline state to the amorphous state depend on voltages applied to the functional layers 15 and 75 and areas that are perpendicular to the stacking direction. The areas changing from the crystalline state to the amorphous state become larger when voltages applied to the functional layers 15 and 75 become higher. In addition, areas of the functional layers 15 and 75 that can be changed from the crystalline state to the amorphous state in the functional layers 15 and 75 become larger when areas perpendicular to the stacking direction become larger. When a voltage that is lower than a voltage for the resetting operation and is sufficiently high is applied, the functional layers 15 and 75 that has been changed from the crystalline state to the amorphous state change from the amorphous state to the crystalline state and have decreased resistance values (a setting operation). In this way, the functional layers 15 and 75 are composed of materials of which resistance values change through Joule heating. An operation for increasing the resistance value will be referred to as a resetting operation, and an operation for decreasing the resistance value will be referred to as a setting operation.

The area of the functional layer 15 on the plan view in the z direction is smaller than the area of the functional layer 75 and may be equal to or smaller than ⅔ times or ½ times the area of the functional layer 75. Here, any one of the lengths of the functional layer 15 in the x direction and the y direction may be shorter than the length of the functional layer 75 in the x direction and the length of the functional layer 75 in the y direction. By configuring the areas of the functional layers 15 and 75 of the variable resistance elements 120 and 130 as described above, an area of the variable resistance element 130 of which the crystalline state can be changed through Joule heating can be configured large, and the resistance value can be changed to have more multiple values. In addition, the integration of the variable resistance element 120 is high, and thus more variable resistance element 120 than the variable resistance elements 130 can be disposed.

A thickness T75 of the functional layer 75 is, for example, larger than a thickness T15 of the functional layer 15 and may be equal to or larger than ⅔ times or twice the thickness T15. By configuring the thicknesses of the functional layers 15 and 75 of the variable resistance elements 120 and 130 as described above, the area of the variable resistance element 130 of which the crystalline state can be changed through Joule heating can be configured to be larger, and the resistance value can be changed to have more multiple values.

The area of the lower electrode E1 that is perpendicular to the stacking direction is, for example, smaller than an area of the lower electrode E3 that is perpendicular to the stacking direction and may be ⅔ times or ½ times the area of the lower electrode E3 that is perpendicular to the stacking direction. By decreasing the areas of the lower electrodes E1 and E3 that am perpendicular to the stacking direction, a reset current that is necessary for a resetting operation can be decreased. By configuring the relation of the areas of the lower electrodes E1 and E3 that are perpendicular to the stacking direction as described above in the variable resistance elements 120 and 130, a reset current of the variable resistance elements 120 that are more than the variable resistance elements 130 can be decreased, and a required electric power can be lowered.

The surface roughness of a face on the substrate Sb side out of main faces of the functional layers 15 and 75 may be higher in the functional layer 75 than in the functional layer 15.

The integrated device ID4 is, for example, formed using a stacking process of layers and a working process of a part of each of the layers into a predetermined shape. The layers can be stacked using a means similar to the integrated device ID. In other words, similar to the integrated device ID, after transistors Tr are disposed on a substrate Sb, wiring layers up to the first hierarchical layer are formed.

After stacking up to the first hierarchical layer, wiring layers can be produced using photolithography. Thereafter, a first element group of the first hierarchical layer is produced. First, a lower electrode, a functional layer, and an upper electrode are sequentially stacked, and those electrodes are processed into predetermined shapes. The lower electrode, the functional layer, and the upper electrode respectively become the lower electrode E1, the functional layer 15, and the upper electrode E2. The first element group can be formed using photolithography as well. Thereafter, a wiring layer between the first hierarchical layer and the second hierarchical layer and the second element group of the second hierarchical layer am formed in order similar to that of the process described above, whereby an integrated device ID4 is acquired.

In the example illustrated in FIG. 16, although a configuration in which the variable resistance elements 120 and 130 overlap each other in the plan view in the z direction is illustrated, the variable resistance element 120 and the variable resistance element 130 may not overlap each other in the plan view in the z direction.

A change in the resistance value when a resetting operation is performed depends on a ratio (a change ratio) of an area, which has been changed from the crystalline state to the amorphous state, with respect to the entire size of each of the functional layers 15 and 75. A size of an area that is changed from the crystalline state to the amorphous state has a positive correlation with the magnitude of a pulse applied to the functional layers 15 and 75. In the functional layer 75 larger than the functional layer 15, by finely setting the magnitude of the pulse, the change ratio can be more finely changed than the functional layer 15.

Figure 17:
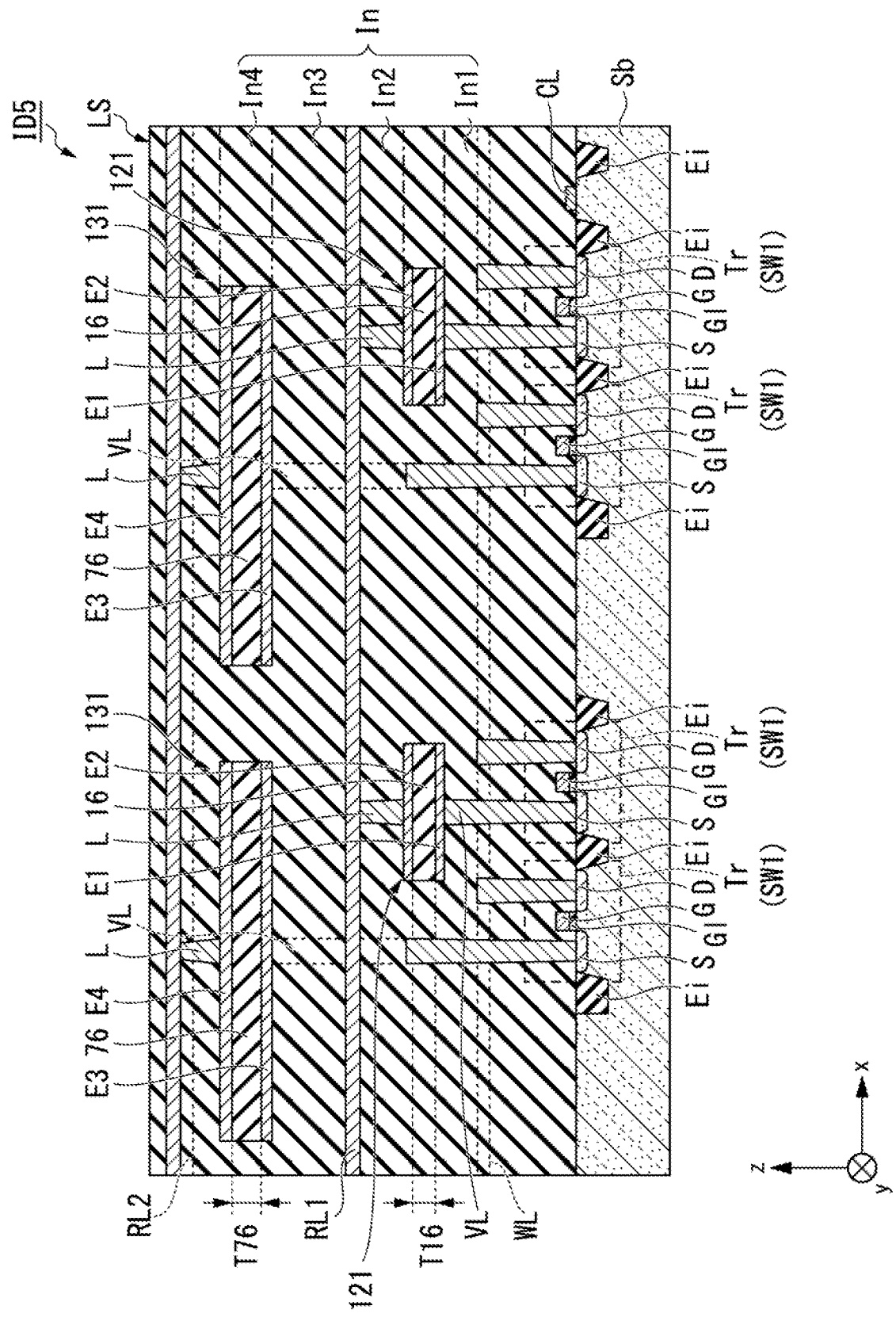
FIG. 17 is a cross-sectional view of feature pans of an integrated device relating to another example of an integrated device that is used in the neuromorphic device according to the fifth embodiment.

FIG. 17 is one example of a cross-sectional view of an integrated device ID5 used in the neuromorphic device according to the fifth embodiment. In the integrated device ID5, a material of the functional layers 16 and 76 of the variable resistance elements 121 and 131 are different from a material of the functional layers 15 and 75 of the variable resistance elements 120 and 130 of the integrated device ID4. In addition, the size of the lower electrodes E1 and E3 of the integrated device ID5 is different from that of the integrated device ID4. In the integrated device ID5, the same reference signs will be assigned to components similar to those of the integrated device ID4, and description thereof will be omitted.

Similar to the variable resistance elements 120 and 130, the variable resistance elements 121 and 131 are elements of a two-terminal type. The variable resistance elements 121 and 131 are, for example, ReRAMs. As the ReRAMs, any one of a unipolar type, a bipolar type, a filament type, and an interfacial type can be used. The variable resistance element 121 is, for example, the first variable resistance element that is arranged in the first hierarchical layer, and the variable resistance element 131 is, for example, the second variable resistance element that is arranged in the second hierarchical layer.

The variable resistance elements 121 and 131, for example, respectively include lower electrodes E1 and E3, functional layers 16 and 76, and upper electrodes E2 and E4 overlapping in the stacking direction. The lower electrodes E1 and E3 are connected to via wirings VL. The upper electrodes E2 and E4 of the variable resistance elements 121 and 131 are connected to wirings L.

The variable resistance element 131 is, for example, disposed at a position further away from the substrate Sb than the variable resistance element 121. At least a part of the variable resistance element 121, for example, overlaps the variable resistance element 131. All the ends of the variable resistance element 121 may be disposed on all the inner sides of the variable resistance element 131 on a plan view in the z direction. In such a configuration, both ends of the variable resistance element 121 in the longitudinal direction are on the inner sides of both ends of the variable resistance element 131 in the longitudinal direction. For example, more variable resistance elements 121 than the variable resistance elements 131 may be provided.

The functional layers 16 and 76 contain a multi-element metal oxide containing a plurality of metal elements such as a perovskite type metal oxide or a two-element metal oxide composed of one type of metal element and oxygen and, for example, is composed of a multi-element metal oxide or a two-element metal oxide. More specifically, as materials composing the functional layers 16 and 76, $TiO_x$, $TaO_x$, $HfO_x$, $SrRuO_3$, a graphene oxide, and the like may be used.

In a case in which a metal oxide having a high insulating property is used as the material of the functional layers 16 and 76, the variable resistance elements 121 and 131, for example, represent filament-type operation mechanisms.

In a filament-type operation mechanism, a filament that is a conductive path is formed inside a metal oxide, and thereafter, by opening/closing a part of the filament using an oxidation-reduction reaction of a metal oxide caused by Joule heating or an electro-chemical effect according to application of a voltage, the resistance values of the variable resistance elements 121 and 131 are changed.

Hereinafter, a specific operation principle will be described.

When a sufficiently-high voltage is applied to the functional layers 16 and 76, conductive paths connected from the upper electrodes E2 and E4 to the lower electrodes E1 and E3 are formed (forming). Hereinafter, in this embodiment, these conductive paths will be referred to as filaments.

Thereafter, when a voltage is applied between the upper electrodes E2 and E4 and the lower electrodes E1 and E3, and a current is applied to the filament, a part of the filament is changed, and the formed filament is cut. In other words, information of the variable resistance elements 121 and 131 can be removed (a resetting operation). At the time of a resetting operation, the resistance values of the functional layers 16 and 76 of the variable resistance elements 121 and 131 increase.

Thereafter, when currents are caused to flow between the upper electrodes E2 and E4 and the lower electrodes E1 and E3, filaments connected from the upper electrodes E2 and E4 to the lower electrodes E1 and E3 are formed again. In other words, information can be written into the variable resistance elements 121 and 131 (a setting operation). At the time of the setting operation, the resistance values of the functional layers 16 and 76 of the variable resistance elements 121 and 131 decrease.

The number of filaments formed in each of the functional layers 16 and 76 of the variable resistance elements 121 and 131 representing the filament-type operation principle is not limited to one and may be two or more. An area of the functional layer 76 that is perpendicular to the z direction is larger than the area of the functional layer 16 that is perpendicular to the z direction. For this reason, a change in the resistance value at the time of forming one filament is smaller in the variable resistance element 131 than in the variable resistance element 121. Thus, the resolution of the variable resistance element 131 is higher than that of the variable resistance element 121. In addition, the variable resistance element 121 has a resistance change smaller than the variable resistance element 131 and can be integrated with a high density.

As semiconductor metal oxide is used as the material of the functional layers 16 and 76, for example, the variable resistance elements 121 and 131 represent operation mechanisms of an interfacial type.

In the operation mechanisms of the interfacial type, when a voltage is applied between the lower electrodes E2 and FA and the upper electrodes E1 and E3, oxygen deficiency occurs near a junction interface in accordance with electric fields between both electrodes, and the resistance values of the functional layers 16 and 76 change.

Resistance values in the operation mechanisms of the interfacial type are more difficult to change, as the element areas of the variable resistance elements 121 and 131 become larger. For this reason, in the variable resistance element 131 having a large element area, power consumption is high. From the point of view of decreasing power consumption, the number of variable resistance elements 131 may be smaller than the number of variable resistance elements 121.

The area of the functional layer 16 in the plan view in the z direction is smaller than the area of the functional layer 76 and may be equal to or smaller than ⅔ times or ½ times the area of the functional layer 76. Here, any one of the length of the functional layer 16 in the x direction and the length of the functional layer 16 in the y direction may be shorter than the length of the functional layer 76 in the x direction and the length of the functional layer 76 in the y direction. By configuring the areas of the functional layers 16 and 76 of the variable resistance elements 121 and 131 as described above, in the variable resistance element 131, an area of which a resistance can be changed in accordance with formation of a filament, oxidation-reduction of the interface, or the like can be increased, and the resistance value can be changed to more multiple values. In addition, the integration of the variable resistance element 121 is high, and thus more variable resistance elements 12 than the variable resistance elements 131 can be disposed.

From the point of view of increasing the resolution of the variable resistance element 131, the thickness T76 of the functional layer 76 is, for example, larger than the thickness T16 of the functional layer 16 and may be equal to or larger than 3/2 times or twice the thickness T16. On the other hand, in a case in which the number of variable resistance elements 131 is smaller than the number of variable resistance elements 121, from the point of view of inhibiting from being small with a degree for which a sum of currents of an element group composed of the variable resistance elements 131 cannot be detected, the thickness T76 of the functional layer 76 of the variable resistance element 131, for example, may be smaller than the thickness T16 of the functional layer 16 of the variable resistance element 121.

An area of the lower electrode E1 that is perpendicular to the stacking direction is, for example, smaller than an area of the lower electrode E3 that is perpendicular to the stacking direction and may be ⅔ times or ½ times the area of the lower electrode E3 that is perpendicular to the stacking direction.

The surface roughness of a face on the substrate Sb side out of main faces of the functional layers 16 and 76 may be higher in the functional layer 76 than in the functional layer 16.

The integrated device ID5 is produced using a method similar to that of the integrated device ID4. Also the neuromorphic device including the integrated device MDS has effects similar to the neuromorphic device according to the first embodiment.

Figure 18A:
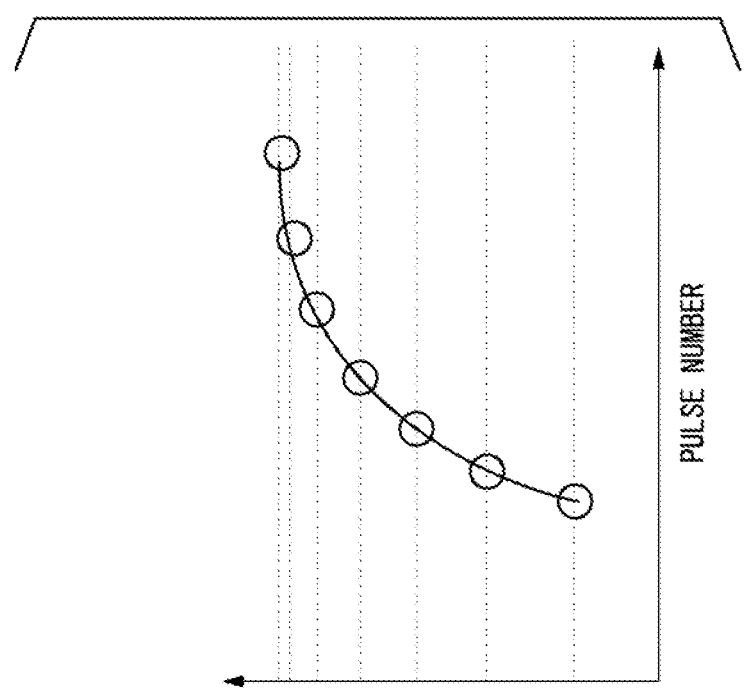
FIGS. 18A and 18B are image diagrams illustrating appearances of changes in a resistance value with respect to the pulse number applied to a variable resistance element disposed in the integrated device used in the neuromorphic device according to the fifth embodiment.
Figure 18B:
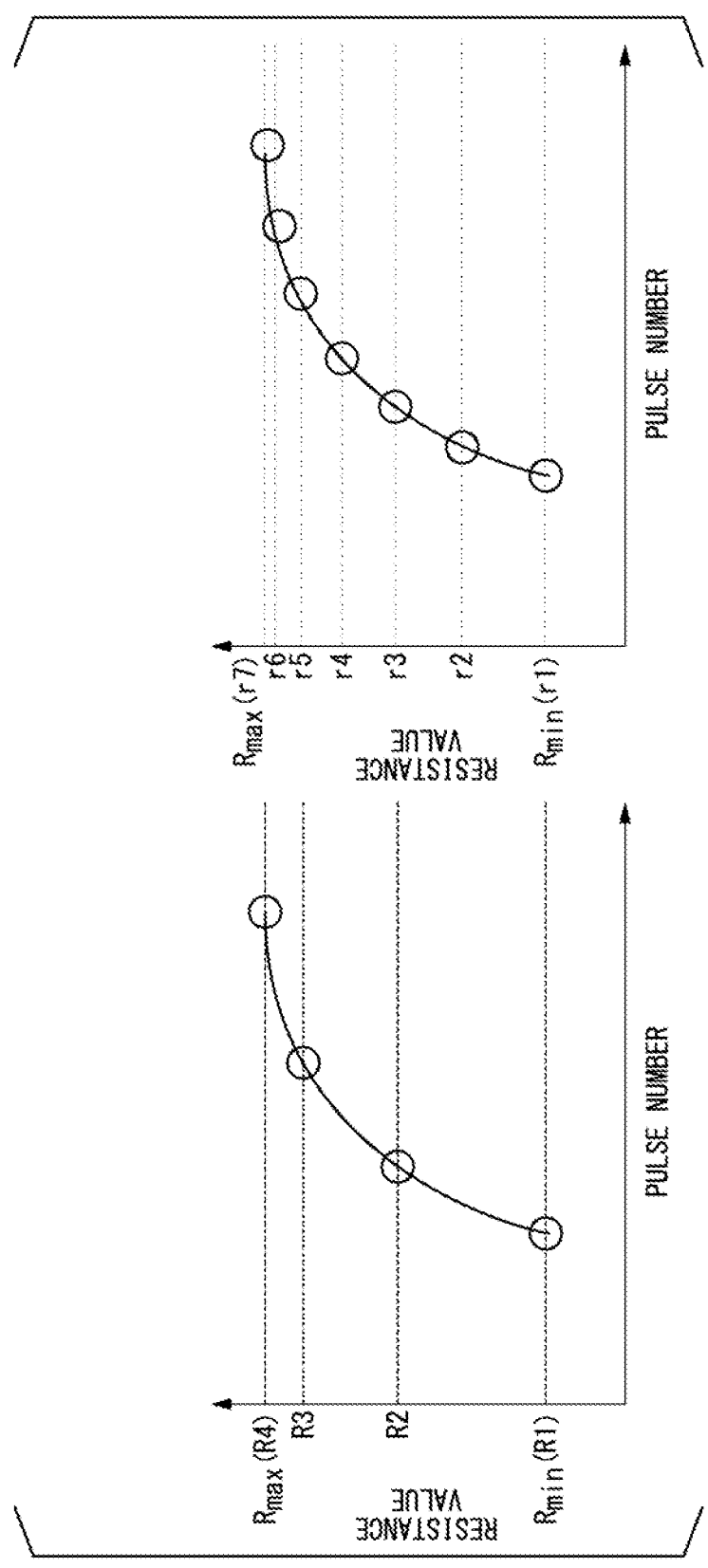

FIGS. 18A and 18B are image diagrams illustrating relations between resistance values of the first variable resistance element and the second variable resistance element and the pulse number applied to the first variable resistance element and the second variable resistance element. FIG. 18A is a graph relating to the first variable resistance element, and FIG. 18B is a graph relating to the second variable resistance element. When the pulse number applied to the first variable resistance element and the second variable resistance element increases, the resistance values of the first variable resistance element and the second variable resistance element increase. In FIGS. 18A and 18B, although the image diagrams in which the resistance values increase in accordance with pulse inputs are illustrated, a variable resistance element of which a resistance value decreases in accordance with a pulse input may be used in this embodiment. In addition, there are cases in which resistance values of the first variable resistance element and the second variable resistance element nonlinearly change with respect to the number of applied pulses. Also in such cases, the resistance changing rate when a predetermined pulse is input is higher in the first variable resistance element than in the second variable resistance element. Here, even in a case in which the first variable resistance element and the second variable resistance element of which resistance values nonlinearly change with respect to the number of applied pulses are used, a resistance changing rate P is the resistance changing rate similar to the first embodiment represented in Equation (1).

$$P = |R'-R|/(R_{max}-R_{min}) \quad (1)$$

In FIG. 18, $R_{max}$ is a maximum value of the resistance value of the first variable resistance element and the second variable resistance element, and $R_{min}$ is a minimum value of the resistance value of the first variable resistance element and the second variable resistance element. In addition, in Equation (1), $|R'-R|$ is a maximum value of the amounts of change of resistance values of the first variable resistance element and the second variable resistance element when a predetermined pulse is input to the first variable resistance element and the second variable resistance element once. In the first variable resistance element, $|R'-R|=R2-R1$, and, in the second variable resistance element, $|R'-R|=r2-r1$. In addition, in the first variable resistance element and the second variable resistance element, a maximum value and a minimum value of the resistance value may be the same or may be different from each other.

Also according to the neuromorphic device of this embodiment, effects similar to those of the neuromorphic device according to the first embodiment are acquired.

MODIFIED EXAMPLE

In the embodiment described above, the magnitude Jc2 of the critical current density for moving the magnetic domain wall DW of the magnetic domain wall movement element 110 may be smaller than the magnitude Jc1 of the critical current density for moving the magnetic domain wall DW of the magnetic domain wall movement element 100. In other words, the magnetic domain wall movement elements 100 and 110 may satisfy the relation of Jc2<Jc1. By causing the magnetic domain wall movement elements 100 and 110 to satisfy Jc2<Jc1, consumption of electric power required for moving the magnetic domain wall DW of the magnetic domain wall movement element 110 can be inhibited. The magnetic domain wall movement element 110 requires higher resolution than the magnetic domain wall movement element 100, and there are cases in which the pulse number required for acquiring an appropriate resistance value is large. For example, the threshold current densities Jc1 and Jc2 of the magnetic domain wall movement elements 100 and 110 can be changed using compositions, shapes, materials, and the like of the magnetic domain wall movement layers 10 and 50. For example, the magnetic domain wall movement elements 100 and 110 can satisfy the relation of Jc2<Jc1 using the following means.

Modified Example 1

FIG. 19 is a cross-sectional view of magnetic domain wall movement elements 100 and 112 taken along the xz plane passing through the centers of the magnetic domain wall movement layers 10 and 53 in the y direction. FIG. 19 is a cross-sectional view of magnetic domain wall movement elements used in a neuromorphic device according to Modified example 1. In FIG. 19, the magnetic domain wall movement element 100 belonging to a first element group and the magnetic domain wall movement element 112 belonging to a second element group are illustrated. The magnetic domain wall movement element 112 has a magnetic domain wall movement layer 52. The magnetic domain wall movement element 112 has a small thickness h52 of the magnetic domain wall movement layer 52 in the z direction, which is different from the magnetic domain wall movement element 110. The other components are similar to those of the magnetic domain wall movement element 110, and the same reference signs will be assigned thereto, and description thereof will be omitted. A thickness h52 of the magnetic domain wall movement layer 52 is smaller than a thickness h10 of the magnetic domain wall movement layer 10. Since the thickness h52 of the magnetic domain wall movement layer 52 is smaller than the thickness h10 of the magnetic domain wall movement layer 10, the critical current density Jc1 of the magnetic domain wall movement element 100 and the critical current density Jc2 of the magnetic domain wall movement element 112 satisfy the relation of Jc2<Jc1.

Modified Example 2

Figure 20:
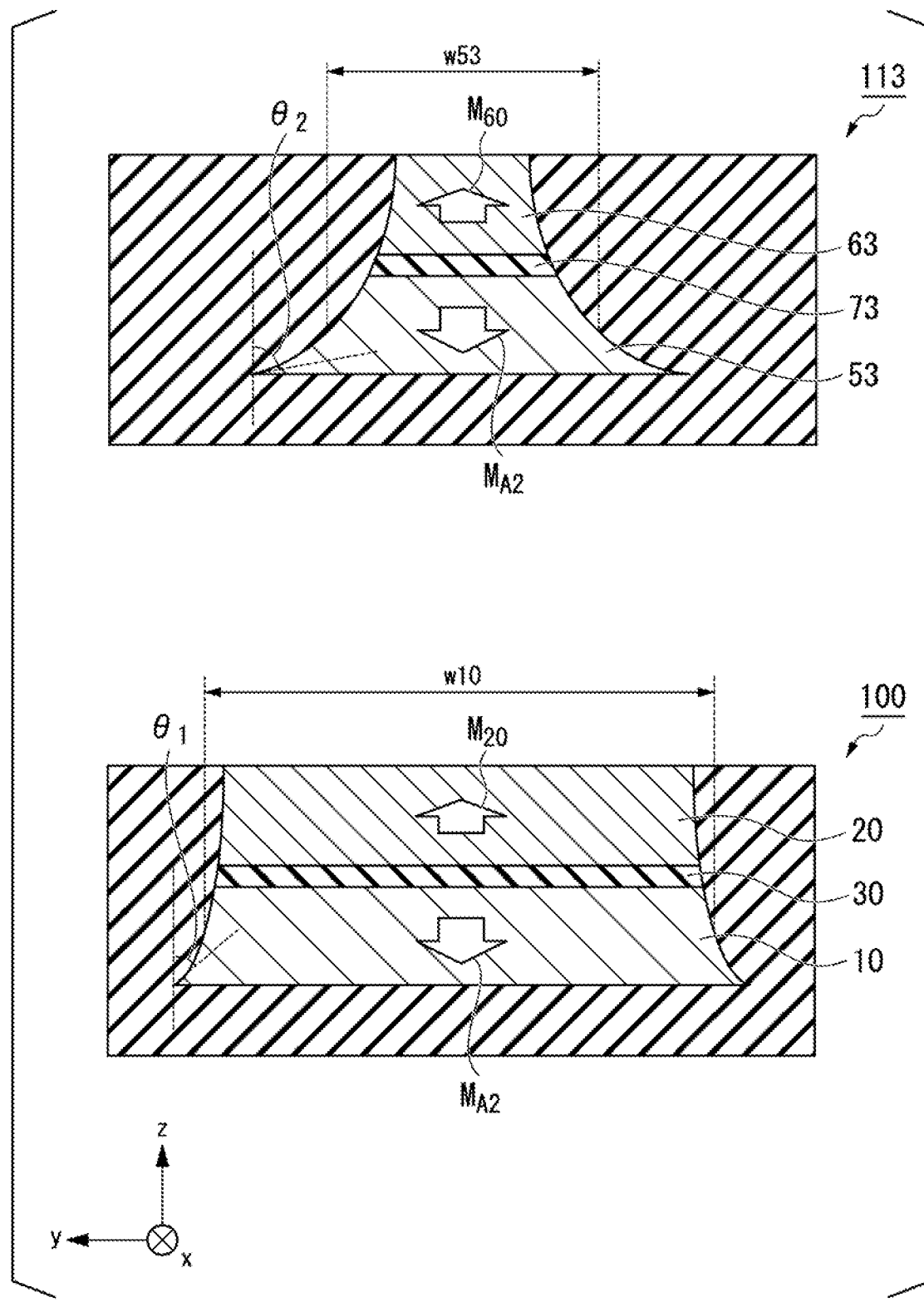
FIG. 20 is a cross-sectional view of a magnetic domain wall movement element belonging to a first element group and a magnetic domain wall movement element belonging to a second element group in an integrated device used in a neuromorphic device according to Modified Example 2.

FIG. 20 is a cross-sectional view of magnetic domain wall movement elements 100 and 113 cut along the yz plane passing through the centers of magnetic domain wall movement layers 10 and 53 in the x direction. The magnetic domain wall movement element 113 belongs to a second element group. The magnetic domain wall movement element 113 has a magnetic domain wall movement layer 53, a ferromagnetic layer 63, and a non-magnetic layer 73. The magnetic domain wall movement element 113 has a short length in the y direction, and a relation satisfied between a width w53 of the magnetic domain wall movement layer 53 and a width $w_{10}$ of the magnetic domain wall movement layer 10 is different from the magnetic domain wall movement element 110. The same reference signs will be assigned to components similar to those of the magnetic domain wall movement element 110, and description thereof will be omitted.

There is a report representing the critical current density of a magnetic domain wall movement layer is a minimum near a line width of 70 nm (for example, T. Koyama, et al., Nat. Mater. 10, 194 (2011)). Thus, in a case in which the line width of the magnetic domain wall movement layer is equal to or larger than 70 nm, it is preferable that the width $w_{53}$ of the magnetic domain wall movement layer 53 be smaller than the width w10 of the magnetic domain wall movement layer 10. On the other hand, in a case in which the line width of the magnetic domain wall movement layer is smaller than 70 nm, it is preferable that the width $w_{53}$ of the magnetic domain wall movement layer 53 be larger than the width w t of the magnetic domain wall movement layer 10. By satisfying the relation described above, the critical current density of the magnetic domain wall movement layer 53 can be configured to be lower than the critical current density of the magnetic domain wall movement layer 10. Here, a width of the magnetic domain wall movement layer in the y direction represents an average of widths of the upper face and the lower face in the y direction.

In addition, an inclination angle $\theta_2$ of the magnetic domain wall movement layer 53 may be larger than the inclination angle $\theta_1$ of the magnetic domain wall movement layer 10. By satisfying such a relation, the critical current density Jc1 of the magnetic domain wall movement element 100 and the critical current density Jc2 of the magnetic domain wall movement element 113 satisfies the relation of Jc2<Jc1.

Modified Example 3

Figure 21:
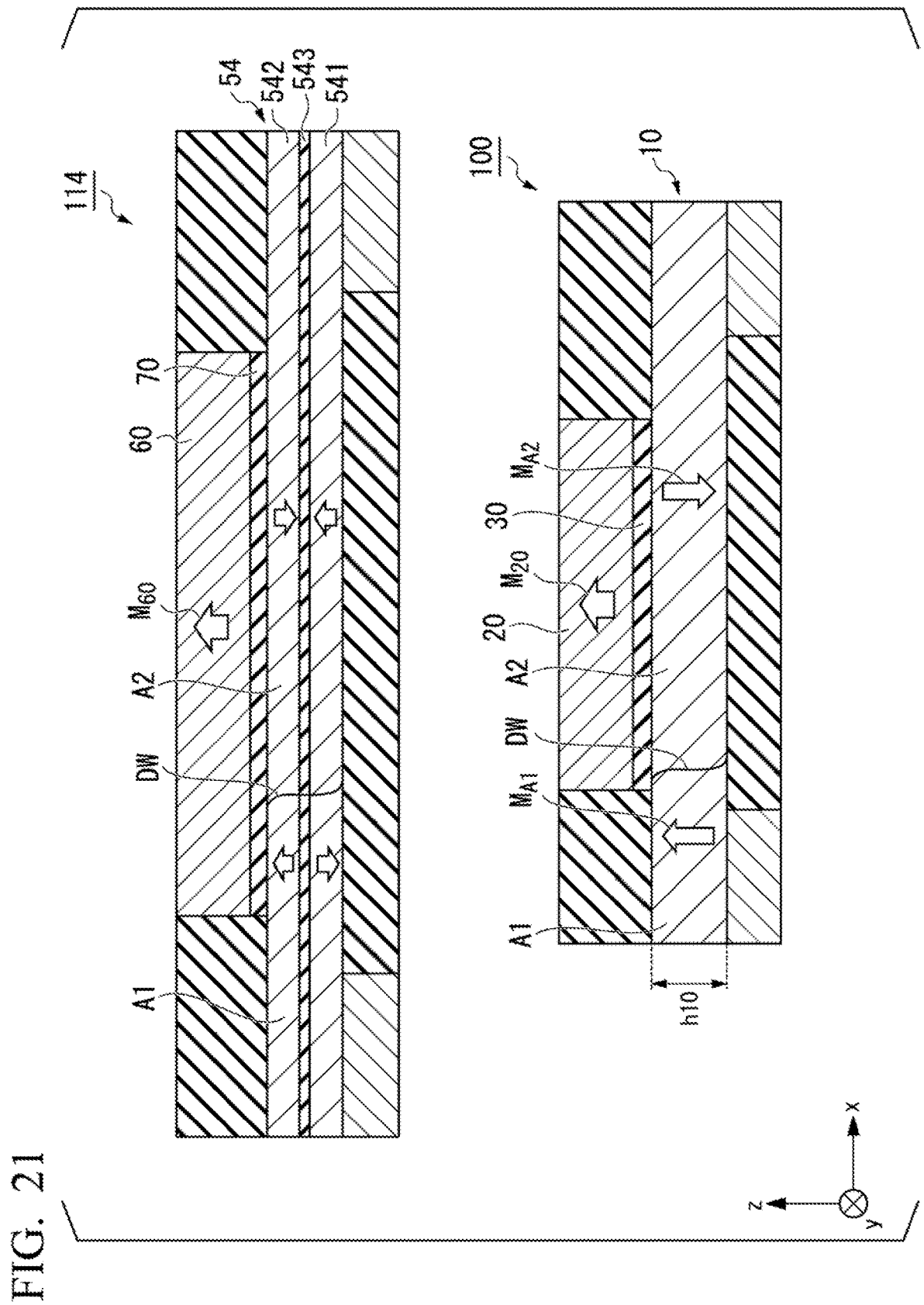
FIG. 21 is a cross-sectional view of a magnetic domain wall movement element belonging to a first element group and a magnetic domain wall movement element belonging to a second element group in an integrated device used in a neuromorphic device according to Modified Example 3.

FIG. 21 is a cross-sectional view of magnetic domain wall movement elements 100 and 114 cut along the xz plane passing through the centers of magnetic domain wall movement layers 10 and 54 in the y direction. The magnetic domain wall movement element 114 belongs to a second element group. In Modified example 3, the configuration of the magnetic domain wall movement element 114 is different from that of the first embodiment. In Modified example 3, the same reference signs will be assigned to components similar to those according to the first embodiment, and description thereof will be omitted.

The magnetic domain wall movement element 114 has a magnetic domain wall movement layer 54, a non-magnetic layer 70, and a ferromagnetic layer 60. The magnetic domain wall movement layer 54 has a ferromagnetic layer 541, a spacer layer 543, and a ferromagnetic layer 542. The spacer layer 543 is interposed between the ferromagnetic layer 541 and the ferromagnetic layer 542 in the z direction. For the ferromagnetic layers 541 and 542, materials similar to the materials of the magnetic domain wall movement layer 10 and the ferromagnetic layer 20 can be used. The spacer layer 543 may contain at least one selected from a group composed of Ru, Ir, and Rh.

The ferromagnetic layer 541 and the ferromagnetic layer 542 are magnetically coupled. The ferromagnetic layer 541 and the ferromagnetic layer 542 are, for example, antiferromagnetically coupled. The ferromagnetic layer 541, the spacer layer 543, and the ferromagnetic layer 542 have a synthetic antiferromagnetic structure (SAF structure). By satisfying such a relation, the critical current density Jc1 of the magnetic domain wall movement element 100 and the critical current density Jc2 of the magnetic domain wall movement element 114 satisfies the relation of Jc2<Jc1.

Modified Example 4

Figure 22:
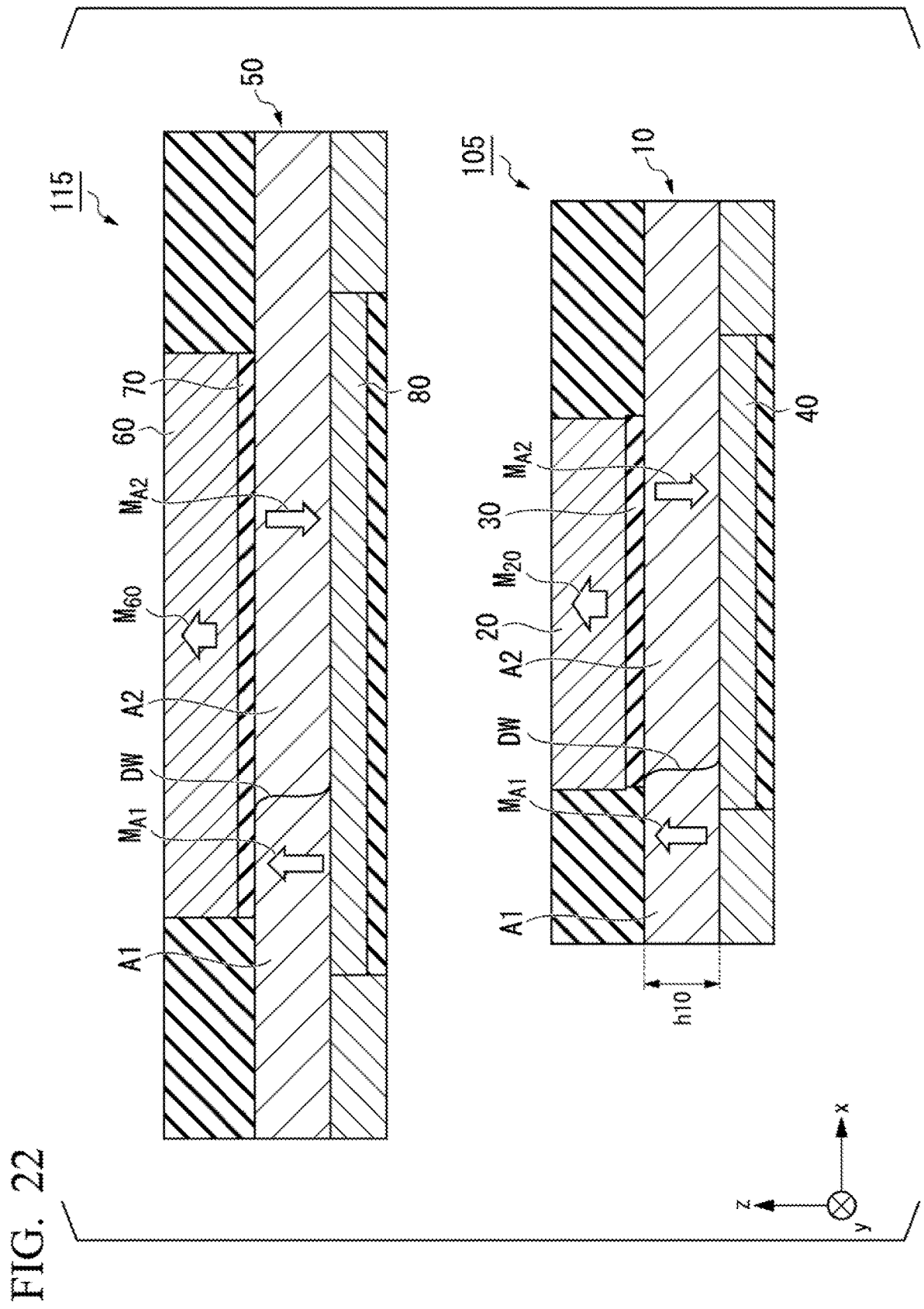
FIG. 22 is a cross-sectional view of a magnetic domain wall movement element belonging to a first element group and a magnetic domain wall movement element belonging to a second element group in an integrated device used in a neuromorphic device according to Modified Example 4.

FIG. 22 is a cross-sectional view of magnetic domain wall movement elements 105 and 115 cut along the xz plane passing through the centers of magnetic domain wall movement layers 10 and 50 in the y direction. The magnetic domain wall movement element 115 belongs to a second element group. In Modified example 4, each of the magnetic domain wall movement elements 105 and 115 includes a wiring layer 40 or a wiring layer 80, which is different from the first embodiment. In the fifth embodiment, the same reference signs will be assigned to components similar to those according to the first embodiment, and description thereof will be omitted.

The wiring layers 40 and 80 are in contact with the magnetic domain wall movement layers 10 and 50. The wiring layers 40 and 80 are at positions interposing the magnetic domain wall movement layers 10 and 50 between them and the non-magnetic layers 30 and 70 in the z direction. The wiring layers 40 and 80 are, for example, present at positions overlapping the ferromagnetic layers 20 and 60 in the z direction. The wiring layer 40 may be interposed between the magnetic domain wall movement layers 10 and 50 and a via wiring VL.

Each of the wiring layers 40 and 80 contains any one of a metal, an alloy, an inter-metal compound, metal boride, metal carbide, metal silicide, and metal phosphide having a function of generating a spin current using a spin Hall effect when current flows.

Each of the wiring layers 40 and 80, for example, contains a non-magnetic heavy metal as its main element. The main element is an element having a highest proportion among elements composing the wiring layers 40 and 80. Each of the wiring layers 40 and 80, for example, contains a heavy metal having specific gravity that is equal to or higher than yttrium (Y). A non-magnetic heavy metal has a large atomic number equal to or greater than an atomic number 39 and has a d electron or an f electron in the outermost shell, and thus a spin orbit interaction strongly occurs. The spin Hall effect is generated in accordance with a spin orbital interaction, a spin may be easily unevenly distributed inside the wiring layers 40 and 80, and a spin current $J_S$ may be easily generated. Each of the wiring layers 40 and 80, for example, contains any one selected from a group consisting of Au, Hf, Mo, Pt, W, and Ta.

A spin Hall angle of the material composing the wiring layer 80 is larger than the spin Hall angle of the material composing the wiring layer 40. The "spin Hall angle" is one index indicating the intensity of a spin Hall effect and represents conversion efficiency of a generated spin current with respect to a current caused to flow along the wiring layers 40 and 80. In other words, as the absolute value of the spin Hall angle becomes larger, the amount of spin injected into the magnetic domain wall movement layers 10 and 50 increases, and a large spin orbit torque (SOT) is applied to magnetization. By satisfying such a relation, the critical current density Jc1 of the magnetic domain wall movement element 1W and the critical current density Jc2 of the magnetic domain wall movement element 115 satisfy the relation of Jc2<Jc1.

In the embodiments and the modified examples described above, although an example in which lengths of all the magnetic domain wall movement elements belonging to the second element group in the longitudinal direction are larger than the lengths of all the magnetic domain wall movement elements belonging to the first element group in the longitudinal direction is illustrated, the present invention is not limited to this example. For example, a configuration in which both the first element group and the second element group have the magnetic domain wall movement elements 100 and 110, and a ratio of the magnetic domain wall movement elements 110 belonging to the second element group is higher than a ratio of the magnetic domain wall movement elements 110 belonging to the first element group may be employed. Even in the case of such a configuration, the resolution of the second element group and the identification rate of the neuromorphic device and the integration of the magnetic domain wall movement elements in the first element group can be improved.

In addition, the embodiments and the modified examples described above have been described on a premised that, as a hierarchical layer becomes closer to the output layer $L_{out}$, a neural network NN more finely changing weights applied to the transmission means is reproduced. In other words, description has been presented on a premise that, as a hierarchical layer becomes closer to the output layer $L_{out}$, high resolution is required. However, the present invention is not limited to this example. In a neural network, there are also cases in which a hierarchical layer closer to the input layer requires higher resolution. In order to reproduce such a neural network, the neuromorphic device according to this embodiment may have a configuration in which the first element group is positioned on the input layer side from the second element group.

Until now, examples of the integrated device and the neuromorphic device have been presented by presenting several embodiments. However, the present invention is not limited to the embodiments, and various changes can be performed in a range not changing the concept of the invention.

Figure 23:
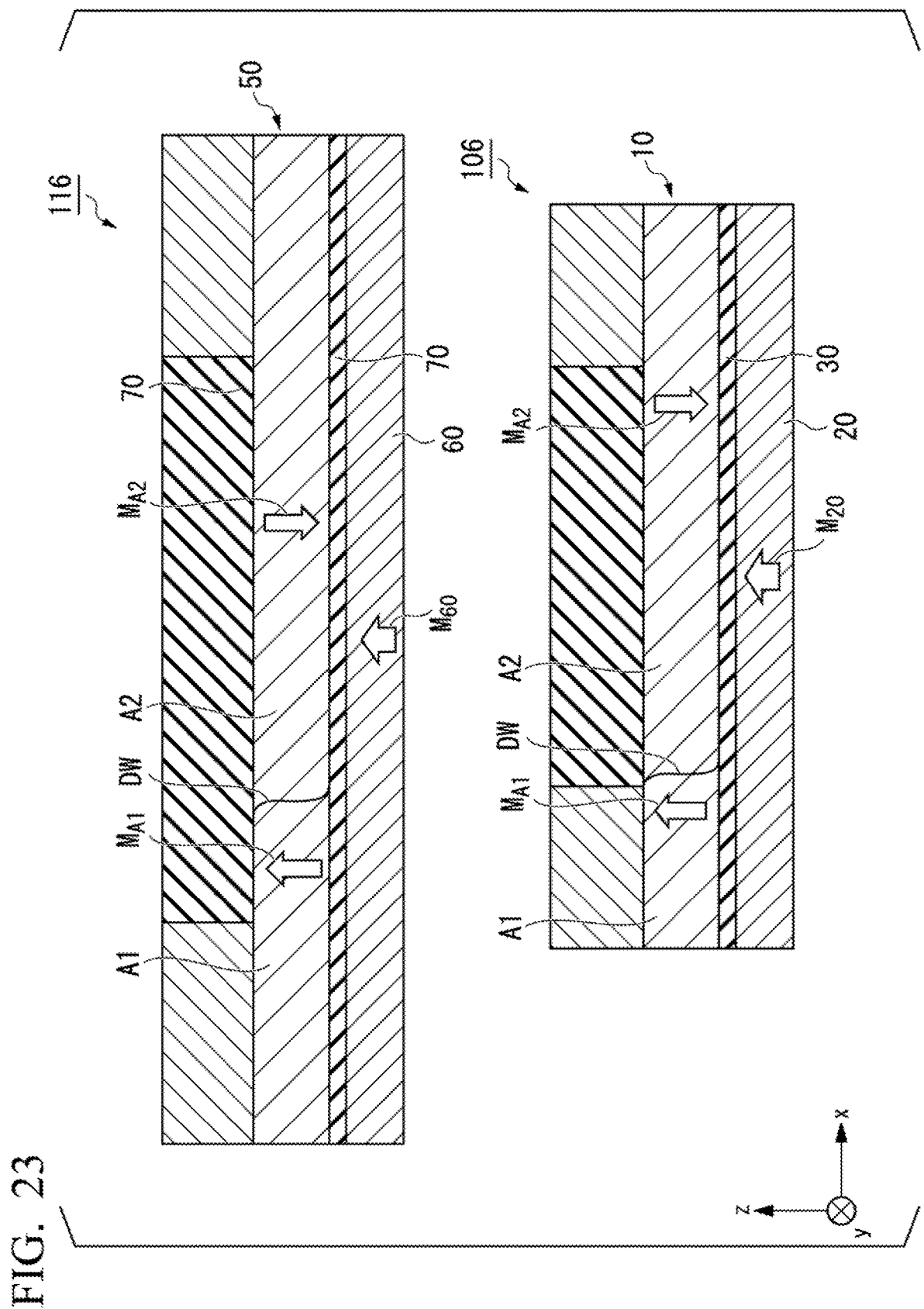
FIG. 23 is a cross-sectional view of a magnetic domain wall movement element belonging to a first element group and a magnetic domain wall movement element belonging to a second element group in an integrated device used in a neuromorphic device according to Modified Example 5.

For example, FIG. 23 is a cross-sectional view of a magnetic domain wall movement element 106 belonging to a first element group and a magnetic domain wall movement element 116 belonging to a second element group in a neuromorphic device according to Modified example 5. As illustrated in FIG. 23, the magnetic domain wall movement layers 10 and 50 may be at positions further away from a substrate Sb from ferromagnetic layers 20 and 60. FIG. 23 is called a bottom pin structure in which the ferromagnetic layers 20 and 60 having relatively high stability of magnetization are disposed on the substrate Sb side. The bottom pin structure illustrated in FIG. 23 has stability of magnetization higher than the top pin structure illustrated in FIG. 8.

Additionally, featured configurations of the embodiments and the modified examples described above may be combined.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES 10, 50, 51, 52, 53, 54 Magnetic domain wall movement layer
20, 60, 61, 63 Ferromagnetic layer
30, 70, 71, 73 Non-magnetic layer
15, 16, 75, 76 Functional layer
40, 80 Wiring layer
100, 104, 105, 110, 111, 112, 113, 114, 115 Magnetic domain wall movement element
120, 121, 130, 131 Variable resistance element
543 Spacer layer
A1 First magnetic domain
A2 Second magnetic domain
C Chip
C1 Firm circuit
C2 Second circuit
C3 Third circuit
CL Common line
CW Connection wiring
DW Magnetic domain wall
E Electrode
ID, ID1, ID2, ID3 Integrated device
In, In1, In2, In3, In4 Insulator
$L_{in}$ Input layer
$L_m$ Intermediate layer
$L_{out}$ Output layer
LS Laminated structural body
NN Neural network
RL, RL1, RL2 Read line
VL Via wiring
VSW Vertical switching element
$\theta 1, \theta 2$ inclination angle

What is claimed is:

1. A neuromorphic device comprising:
a first element group; and
a second element group,
wherein each of the first element group and the second element group includes a plurality of magnetic domain wall movement elements,
wherein each of the plurality of magnetic domain wall movement elements includes a magnetic domain wall movement layer, a ferromagnetic layer, and a non-magnetic layer interposed between the magnetic domain wall movement layer and the ferromagnetic layer,
wherein a length of the magnetic domain wall movement layer of each of the magnetic domain wall movement elements belonging to the first element group in a longitudinal direction is shorter than a length of the magnetic domain wall movement layer of each of the magnetic domain wall movement elements belonging to the second element group in the longitudinal direction, and
wherein a resistance changing rate when a predetermined pulse is input is higher for each of the magnetic domain wall movement elements belonging to the first element group than for each of the magnetic domain wall movement elements belonging to the second element group.

2. The neuromorphic device according to claim 1,
wherein the first element group and the second element group are inside a laminated structural body, and
wherein the laminated structural body is stacked on a substrate.

3. The neuromorphic device according to claim 2, wherein the second element group is at a position further away from the substrate than the first element group in the laminated structural body.

4. The neuromorphic device according to claim 1, wherein the number of the magnetic domain wall movement elements belonging to the first element group is larger than the number of the magnetic domain wall movement elements belonging to the second element group.

5. The neuromorphic device according to claim 1, wherein a critical current density required for moving a magnetic domain wall of the magnetic domain wall movement element is lower in each of the magnetic domain wall movement elements belonging to the second element group than in each of the magnetic domain wall movement elements belonging to the first element group.

6. The neuromorphic device according to claim 1, wherein any one of the magnetic domain wall movement elements of the first element group and any one of the magnetic domain wall movement elements of the second element group at least partially overlap each other in a plan view in a stacking direction of the magnetic domain wall movement element.

7. The neuromorphic device according to claim 1, wherein both ends of any one of the magnetic domain wall movement elements of the first element group are inside both ends of any one of the magnetic domain wall movement elements of the second element group in a longitudinal direction of any one of the magnetic domain wall movement element, belonging to the second element group.

8. The neuromorphic device according to claim 1, wherein the magnetic domain wall movement elements of the first element group and the magnetic domain wall movement elements of the second element group do not overlap each other in a plan view in a stacking direction of the magnetic domain movement element.

9. The neuromorphic device according to claim 1, wherein a surface roughness of a lower face of the magnetic domain wall movement element belonging to the second element group is higher than a surface roughness of a lower face of the magnetic domain wall movement element belonging to the first element group.

10. The neuromorphic device according to claim 1, further comprising a connection wiring connecting any one of the magnetic domain wall movement elements of the first element group and any one of the magnetic domain wall movement elements of the second element group.

11. The neuromorphic device according to claim 1,
wherein the first element group performs a first multiply/accumulate operation, and the second element group performs a second multiply/accumulate operation, and
wherein a sum of outputs from the plurality of magnetic domain wall movement elements belonging to the first element group is input to the magnetic domain wall movement element belonging to the second element group.

12. The neuromorphic device according to claim 1, wherein a pulse length of a write pulse input to the magnetic domain wall movement elements belonging to the second element group is different from a pulse length of a write pulse input to the magnetic domain wall movement elements belonging to the first element group.

13. The neuromorphic device according to claim 1, wherein a pulse amplitude of a write pulse input to the magnetic domain wall movement elements belonging to the second element group is different from a pulse amplitude of a write pulse input to the magnetic domain wall movement elements belonging to the first element group.

14. The neuromorphic device according to claim 1, wherein each of the first element group and the second element group is responsible for a calculation between different layers in a neural network.

15. The neuromorphic device according to claim 1, wherein the first element group is responsible for a calculation of an input layer side of a neural network from the second element group.

* * * * *